United States Patent
Nakagawa

(10) Patent No.: US 11,502,122 B2
(45) Date of Patent: Nov. 15, 2022

(54) IMAGING ELEMENT AND ELECTRONIC DEVICE

(71) Applicant: SONY SEMICONDUCTOR SOLUTIONS CORPORATION, Kanagawa (JP)

(72) Inventor: Haruyuki Nakagawa, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 116 days.

(21) Appl. No.: 16/961,013

(22) PCT Filed: Mar. 5, 2019

(86) PCT No.: PCT/JP2019/008492
§ 371 (c)(1),
(2) Date: Jul. 9, 2020

(87) PCT Pub. No.: WO2019/181466
PCT Pub. Date: Sep. 26, 2019

(65) Prior Publication Data
US 2021/0066358 A1 Mar. 4, 2021

(30) Foreign Application Priority Data
Mar. 19, 2018 (JP) .............................. JP2018-051004

(51) Int. Cl.
*H01L 27/146* (2006.01)
(52) U.S. Cl.
CPC ...... *H01L 27/1463* (2013.01); *H01L 27/1464* (2013.01); *H01L 27/14621* (2013.01);
(Continued)

(58) Field of Classification Search
CPC .......... H01L 27/1463; H01L 27/14627; H01L 27/14636; H01L 27/1464; H01L 27/14645; H01L 27/14509
(Continued)

(56) References Cited

U.S. PATENT DOCUMENTS 8,462,249 B2 * 6/2013 Shinohara ......... H01L 27/14638
257/292
2006/0027844 A1 2/2006 Jung
(Continued)

FOREIGN PATENT DOCUMENTS

CN 101022118 A 8/2007
CN 103403869 A 11/2013
(Continued)

OTHER PUBLICATIONS

International Search Report and Written Opinion of PCT Application No. PCT/JP2019/008492, dated Jun. 4, 2019, 15 pages of ISRWO.

*Primary Examiner* — Dao H Nguyen
(74) *Attorney, Agent, or Firm* — Chip Law Group

(57) ABSTRACT

The present technology relates to an imaging element and an electronic device enabling suppression of generation of noise. Provided with a substrate, a first photoelectric conversion region provided on the substrate, a second photoelectric conversion region provided on the substrate and adjacent to the first photoelectric conversion region, a trench provided on the substrate and between the first photoelectric conversion region and the second photoelectric conversion region, a first impurity region including a first impurity provided on the substrate and on a sidewall of the trench, and a second impurity region including a second impurity provided on the substrate and between the first photoelectric conversion region or the second photoelectric conversion
(Continued)

region and the first impurity region. The present technology can be applied to an imaging element.

10 Claims, 20 Drawing Sheets

(52) U.S. Cl.
CPC .. *H01L 27/14627* (2013.01); *H01L 27/14636* (2013.01); *H01L 27/14645* (2013.01)

(58) Field of Classification Search
USPC .......................................................... 257/446
See application file for complete search history.

(56) References Cited

U.S. PATENT DOCUMENTS

| | | | |
|---|---|---|---|
| 2008/0131990 A1 | 6/2008 | Jung | |
| 2008/0315273 A1 | 12/2008 | Jung | |
| 2010/0084690 A1 | 4/2010 | Adkisson et al. | |
| 2012/0122261 A1 | 5/2012 | Adkisson et al. | |
| 2014/0054662 A1* | 2/2014 | Yanagita | H01L 27/14641 |
| | | | 438/73 |
| 2015/0115388 A1* | 4/2015 | Eda | H01L 27/1463 |
| | | | 257/446 |
| 2016/0211288 A1 | 7/2016 | Yanagita et al. | |
| 2016/0336372 A1 | 11/2016 | Yanagita et al. | |
| 2017/0170217 A1 | 6/2017 | Yanagita et al. | |
| 2017/0271385 A1 | 9/2017 | Yanagita et al. | |
| 2017/0287955 A1* | 10/2017 | Ukigaya | H01L 27/1464 |
| 2018/0350856 A1 | 12/2018 | Masagaki et al. | |
| 2019/0027520 A1 | 1/2019 | Yanagita et al. | |

FOREIGN PATENT DOCUMENTS

| | | |
|---|---|---|
| CN | 107408568 A | 11/2017 |
| DE | 112017000216 T5 | 8/2018 |
| EP | 3410487 A | 12/2018 |
| JP | 2006-049888 A | 2/2006 |
| JP | 2007-221121 A | 8/2007 |
| JP | 2013-175494 A | 9/2013 |
| JP | 2016-184624 A | 10/2016 |
| KR | 10-2006-0013284 A | 2/2006 |
| KR | 10-2014-0015326 A | 2/2014 |
| KR | 10-2018-0108414 A | 10/2018 |
| TW | 201737479 A | 10/2017 |
| WO | 2012/117931 A1 | 9/2012 |
| WO | 2017/130723 A1 | 8/2017 |

\* cited by examiner

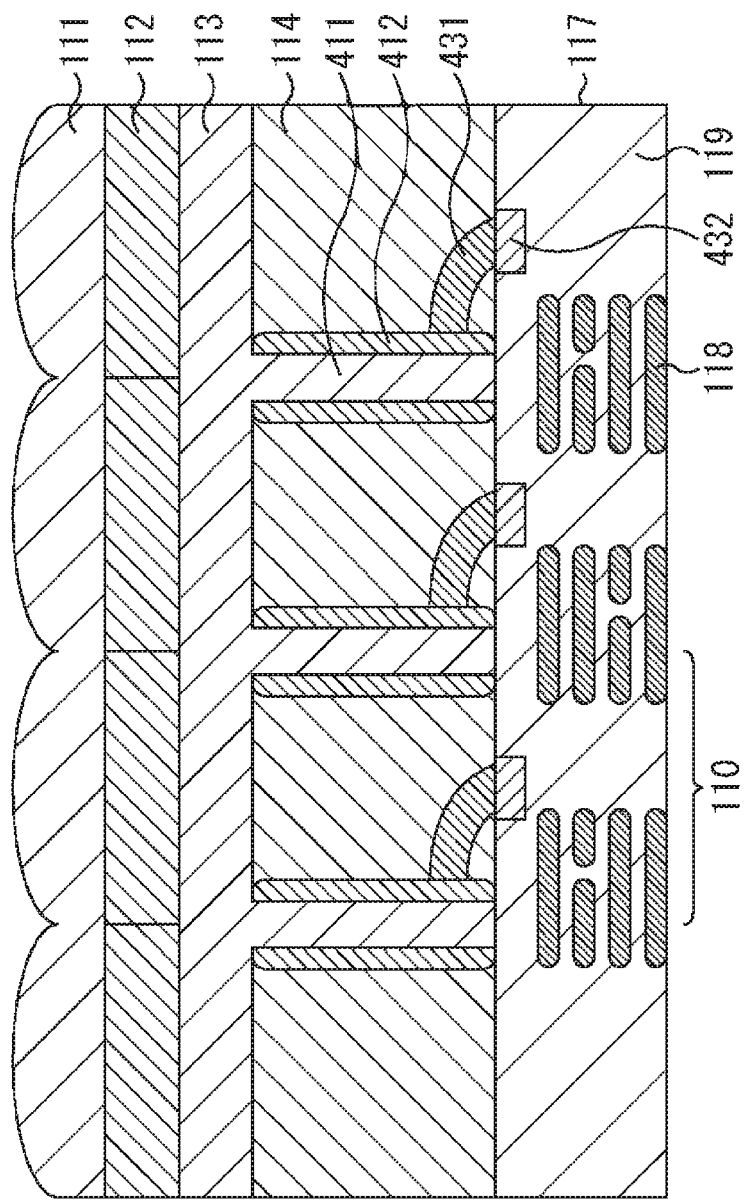

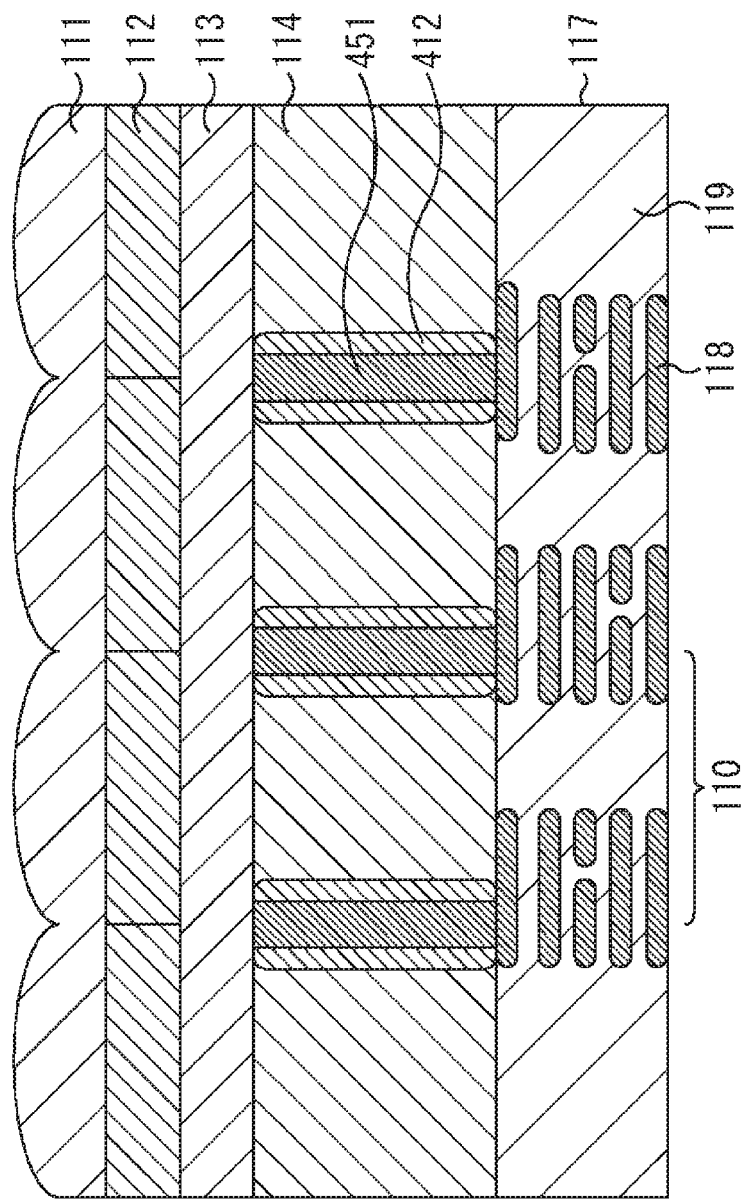

IMAGING ELEMENT AND ELECTRONIC DEVICE

CROSS REFERENCE TO RELATED APPLICATIONS

This application is a U.S. National Phase of International Patent Application No. PCT/JP2019/008492 filed on Mar. 5, 2019, which claims priority benefit of Japanese Patent Application No. JP 2018-051004 filed in the Japan Patent Office on Mar. 19, 2018. Each of the above-referenced applications is hereby incorporated herein by reference in its entirety.

TECHNICAL FIELD

The present technology relates to an imaging element and an electronic device, and for example, relates to an imaging element and an electronic device enabling suppression of noise by electric charges generated due to a defect in a pixel isolation portion.

BACKGROUND ART

Conventionally, a complementary metal oxide semiconductor (CMOS) image sensor provided in a solid-state imaging device includes elements such as a photodiode and a transistor for each pixel. Furthermore, as a CMOS image sensor, there is also a proposal for a configuration including deep trench isolation (DTI) between pixels, the DTI electrically isolating adjacent pixels.

When forming a DTI, there is a possibility that a defect occurs, for example, in a sidewall of the DTI due to processing such as etching, and electrons are generated from the defect. As a structure for trapping the electrons, Patent Document 1 proposes forming carbon II inside a P-type beside an STI to form a gettering layer.

CITATION LIST

Patent Document

Patent Document 1: Japanese Patent Application Laid-Open No. 2016-184624

SUMMARY OF THE INVENTION

Problems to be Solved by the Invention

As a countermeasure against unnecessary electric charges generated from the DTI, it is desired to make the electrical isolation between pixels more complete and further suppress noise.

The present technology has been made in view of the foregoing, and enables reduction in noise.

Solutions to Problems

A first imaging element according to one aspect of the present technology includes a substrate; a first photoelectric conversion region provided on the substrate; a second photoelectric conversion region provided on the substrate and adjacent to the first photoelectric conversion region; a trench provided on the substrate and between the first photoelectric conversion region and the second photoelectric conversion region; a first impurity region including a first impurity provided on the substrate and on a sidewall of the trench; and a second impurity region including a second impurity provided on the substrate and between the first photoelectric conversion region or the second photoelectric conversion region and the first impurity region.

A second imaging element according to one aspect of the present technology includes a substrate; a first photoelectric conversion region provided on the substrate; a second photoelectric conversion region provided on the substrate and adjacent to the first photoelectric conversion region; a trench provided on the substrate and between the first photoelectric conversion region and the second photoelectric conversion region; a first conductivity-type semiconductor region by a first impurity provided on the substrate and on a sidewall of the trench; and a second conductivity-type semiconductor region by a second impurity provided on the substrate and between the first photoelectric conversion region or the second photoelectric conversion region and the first conductivity-type semiconductor region.

An electronic device according to one aspect of the present technology includes, in the electronic device in which an imaging element is mounted, the imaging element including: a substrate; a first photoelectric conversion region provided on the substrate; a second photoelectric conversion region provided on the substrate and adjacent to the first photoelectric conversion region; a trench provided on the substrate and between the first photoelectric conversion region and the second photoelectric conversion region; a first impurity region including a first impurity provided on the substrate and on a sidewall of the trench; and a second impurity region including a second impurity provided on the substrate and between the first photoelectric conversion region or the second photoelectric conversion region and the first impurity region.

In the first imaging element according to one aspect of the present technology, a substrate, a first photoelectric conversion region provided on the substrate, a second photoelectric conversion region provided on the substrate and adjacent to the first photoelectric conversion region, a trench provided on the substrate and between the first photoelectric conversion region and the second photoelectric conversion region, a first impurity region including a first impurity provided on the substrate and on a sidewall of the trench, and a second impurity region including a second impurity provided on the substrate and between the first photoelectric conversion region or the second photoelectric conversion region and the first impurity region are provided.

In the second imaging element according to one aspect of the present technology, a substrate, a first photoelectric conversion region provided on the substrate, a second photoelectric conversion region provided on the substrate and adjacent to the first photoelectric conversion region, a trench provided on the substrate and between the first photoelectric conversion region and the second photoelectric conversion region, a first conductivity-type semiconductor region by a first impurity provided on the substrate and on a sidewall of the trench, and a second conductivity-type semiconductor region by a second impurity provided on the substrate and between the first photoelectric conversion region or the second photoelectric conversion region and the first conductivity-type semiconductor region are provided.

The electronic device according to the one aspect of the present technology includes the first imaging element.

Effects of the Invention

According to one aspect of the present technology, the noise can be reduced.

Note that the effects described here are not necessarily limited, and any of effects described in the present disclosure may be exhibited.

BRIEF DESCRIPTION OF DRAWINGS

FIG. 14 is a vertical cross-sectional view illustrating a configuration example of another pixel.

FIG. 15 is a vertical cross-sectional view illustrating a configuration example of another pixel.

MODE FOR CARRYING OUT THE INVENTION

Hereinafter, modes for implementing the present technology (hereinafter referred to as embodiments) will be described.

Since the present technology can be applied to an imaging device, a case where the present technology is applied to an imaging device will be described here as an example. Note that, here, description will be given by taking an imaging device as an example but the present technology is not limited to application to an imaging device and can be applied to various electronic devices using an imaging device as an image capturing unit (photoelectric conversion unit), such as an imaging device like a digital still camera or a video camera, a portable terminal device having an imaging function like a mobile phone, a copying machine using an imaging device as an image reading unit, or the like. Note that a module-type configuration mounted on an electronic device, that is, a camera module may be adopted as an imaging device.

Figure 1:
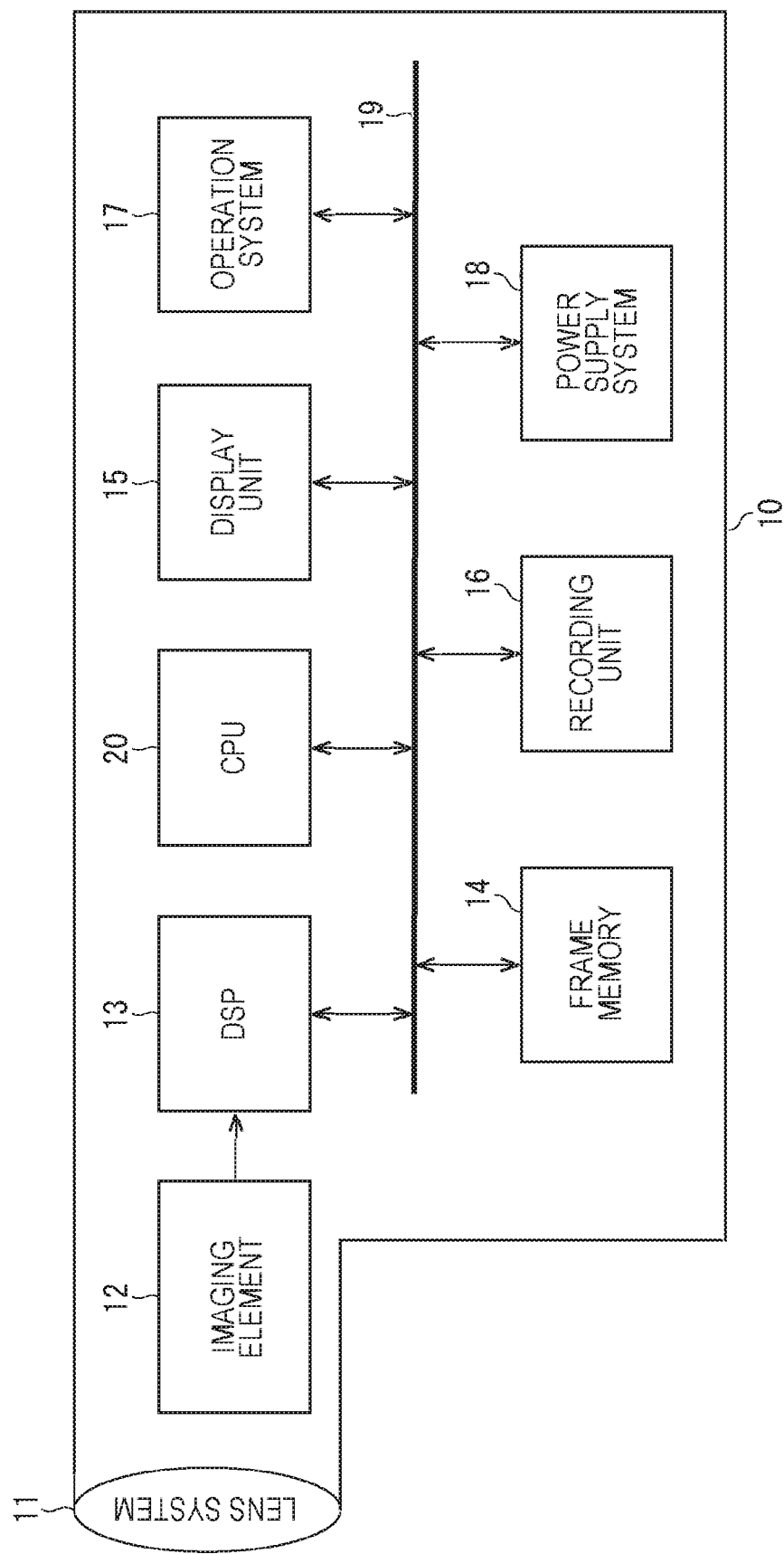
FIG. 1 is a diagram illustrating a configuration example of an imaging device.

FIG. 1 is a block diagram illustrating a configuration example of an imaging device that is an example of an electronic device of the present disclosure. As illustrated in FIG. 1, an imaging device 10 includes an optical system including a lens group 11 or the like, an imaging element 12, a DSP circuit 13 that is a camera signal processing unit, a frame memory 14, a display unit 15, a recording unit 16, an operation system 17, a power supply system 18, and the like.

Then, the DSP circuit 13, the frame memory 14, the display unit 15, the recording unit 16, the operation system 17, and the power supply system 18 are mutually connected through a bus line 19. A CPU 20 controls each unit in the imaging device 10.

The lens group 11 takes in incident light (image light) from an object and forms an image on an imaging surface of the imaging element 12. The imaging element 12 converts a light amount of the incident light imaged on the imaging surface by the lens group 11 into an electrical signal in pixel units and outputs the electrical signal as a pixel signal. As the imaging element 12, an imaging element (image sensor) including pixels to be described below can be used.

The display unit 15 includes a panel-type display unit such as a liquid crystal display unit or an organic electro luminescence (EL) display unit, and displays a moving image or a still image imaged by the imaging element 12. The recording unit 16 records the moving image or the still image captured by the imaging element 12 in a recording medium such as a hard disk drive (HDD) or a memory card.

The operation system 17 issues operation commands for various functions of the present imaging device under an operation by a user. The power supply system 18 appropriately supplies various power sources serving as operating power sources of the DSP circuit 13, the frame memory 14, the display unit 15, the recording unit 16, and the operation system 17 to these supply targets.

<Configuration of Imaging Element>

Figure 2:
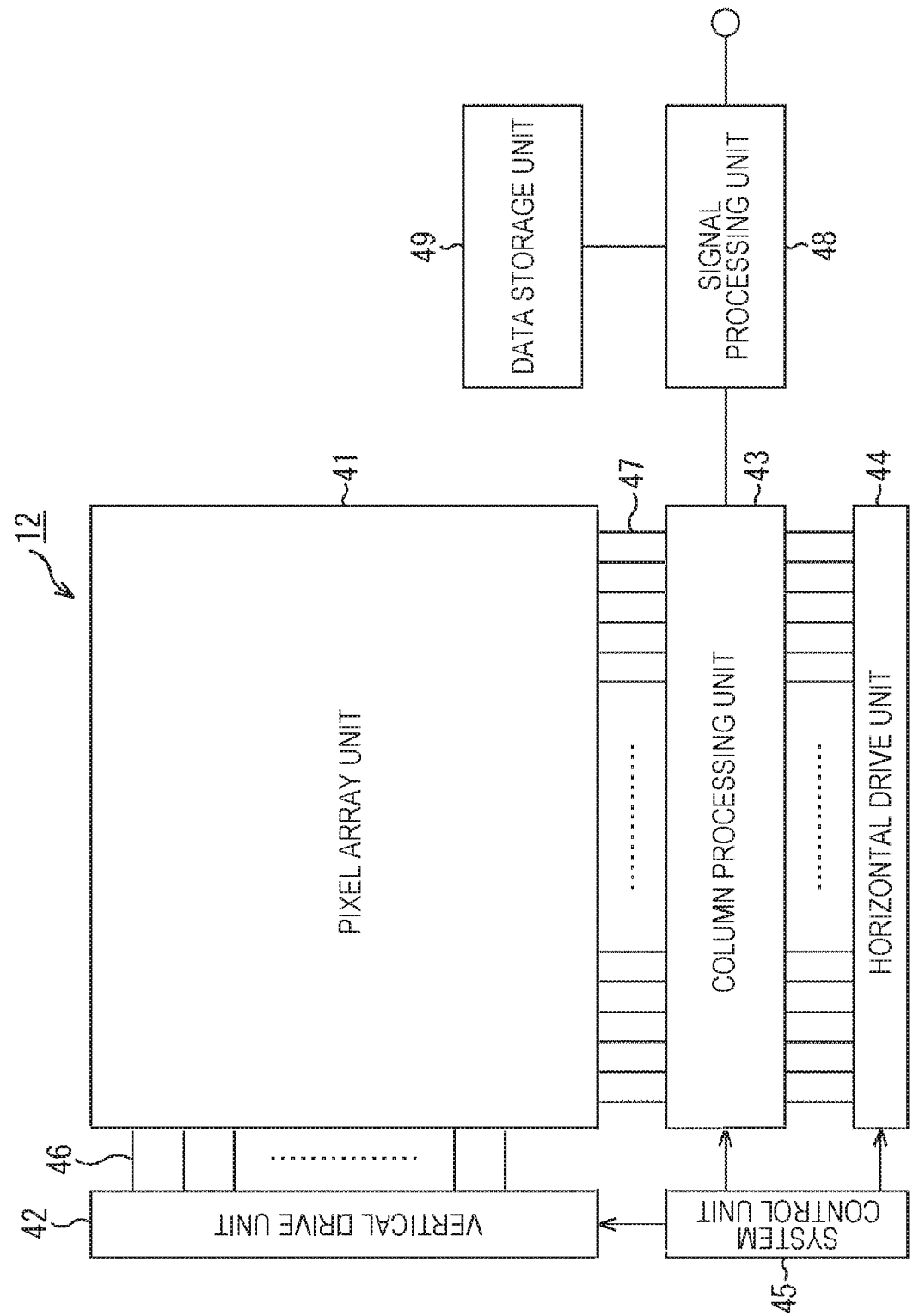
FIG. 2 is a diagram illustrating a configuration example of an imaging element.

FIG. 2 is a block diagram illustrating a configuration example of the imaging element 12. The imaging element 12 can be a complementary metal oxide semiconductor (CMOS) image sensor.

The imaging element 12 includes a pixel array unit 41, a vertical drive unit 42, a column processing unit 43, a horizontal drive unit 44, and a system control unit 45. The pixel array unit 41, the vertical drive unit 42, the column processing unit 43, the horizontal drive unit 44, and the system control unit 45 are formed on a semiconductor substrate (chip) (not illustrated).

In the pixel array unit 41, unit pixels (for example, the pixels 110 in FIG. 3) each including a photoelectric conversion element that generates a photocharge having an electric charge amount corresponding to an incident light amount and accumulates the generated photocharge therein are two-dimensionally arranged in a matrix manner. Note that, hereinafter, the photocharge having the electric charge amount corresponding to the incident light amount may be simply described as "electric charge", and the unit pixel may be simply described as "pixel".

Moreover, in the pixel array unit 41, a pixel drive line 46 is formed for each row in a right-left direction in FIG. 2 (a pixel array direction of a pixel row) and a vertical signal line 47 is formed for each column in an up-down direction in FIG. 2 (a pixel array direction of a pixel column) with respect to a pixel array in the matrix manner. One end of the pixel drive line 46 is connected to an output end corresponding to each row of the vertical drive unit 42.

The imaging element 12 further includes a signal processing unit 48 and a data storage unit 49. Processing by the signal processing unit 48 and the data storage unit 49 may be processing by an external signal processing unit, for example, a digital signal processor (DSP) provided on a separate substrate from the imaging element 12 or by software, or the signal processing unit 48 and the data storage unit 49 may be mounted on the same substrate as the imaging element 12.

The vertical drive unit 42 is a pixel drive unit including a shift register, an address decoder, and the like, and drives all of pixels of the pixel array unit 41 at the same time or drives the pixels on a row basis, or the like. Although illustration of a specific configuration is omitted, the vertical drive unit 42 has a configuration including a readout scanning system and a sweepout scanning system, or batch sweeping and batch transfer.

The readout scanning system sequentially selects and scans the unit pixels of the pixel array unit 41 on a row basis in order to read signals from the unit pixels. In a case of row drive (rolling shutter operation), as for sweeping, sweepout scanning is performed for a readout row, for which readout scanning will be performed by the readout scanning system, ahead of the readout scanning by the time of a shutter speed. Furthermore, in a case of global exposure (global shutter operation), the batch sweepout is performed ahead of the batch transfer by the time of a shutter speed.

By the sweepout, unnecessary electric charges are swept out (reset) from the photoelectric conversion elements of the unit pixels of the readout row. Then, a so-called electronic shutter operation is performed by the sweeping out (resetting) of the unnecessary electric charges. Here, the electronic shutter operation refers to an operation of discarding photocharges of the photoelectric conversion element and starting new exposure (starting accumulation of photocharges).

The signal read by the readout operation by the readout scanning system corresponds to the amount of light incident on or after an immediately preceding readout operation or the electronic shutter operation. In the case of row drive, a period from readout timing by the immediately preceding readout operation or from sweepout timing by the electronic shutter operation to readout timing by the current readout operation is an accumulation period (exposure period) of the photocharges in the unit pixel. In the case of global exposure, a period from the batch sweepout to the batch transfer is an accumulation period (exposure period).

The pixel signal output from each unit pixel in the pixel row selectively scanned by the vertical drive unit 42 is supplied to the column processing unit 43 through each of the vertical signal lines 47. The column processing unit 43 performs, for each pixel column of the pixel array unit 41, predetermined signal processing for the pixel signal output from each unit pixel in the selected row through the vertical signal line 47, and temporarily stores the pixel signal after the signal processing.

Specifically, the column processing unit 43 performs at least noise removal processing, for example, correlated double sampling (CDS) processing as the signal processing. The correlated double sampling by the column processing unit 43 removes fixed pattern noises peculiar to pixels such as reset noise and variation in threshold value of an amplification transistor. Note that the column processing unit 43 can have an analog-digital (AD) conversion function, for example, in addition to the noise removal processing, and can output a signal level as a digital signal.

The horizontal drive unit 44 is configured by a shift register, an address decoder, and the like, and sequentially selects a unit circuit corresponding to the pixel column of the column processing unit 43. By the selective scanning by the horizontal drive unit 44, pixel signals processed by the column processing unit 43 are sequentially output to the signal processing unit 48.

The system control unit 45 is configured by a timing generator that generates various timing signals, and the like, and drives and controls the vertical drive unit 42, the column processing unit 43, the horizontal drive unit 44, and the like, on the basis of the various timing signals generated by the timing generator.

The signal processing unit 48 has at least an addition processing function and performs various types of signal processing such as addition processing for the pixel signal output from the column processing unit 43. The data storage unit 49 temporarily stores data necessary for the signal processing in the signal processing unit 48.

<Structure of Unit Pixel>

Next, a specific structure of the unit pixels 110 arranged in a matrix manner in the pixel array unit 41 will be described.

Figure 3:
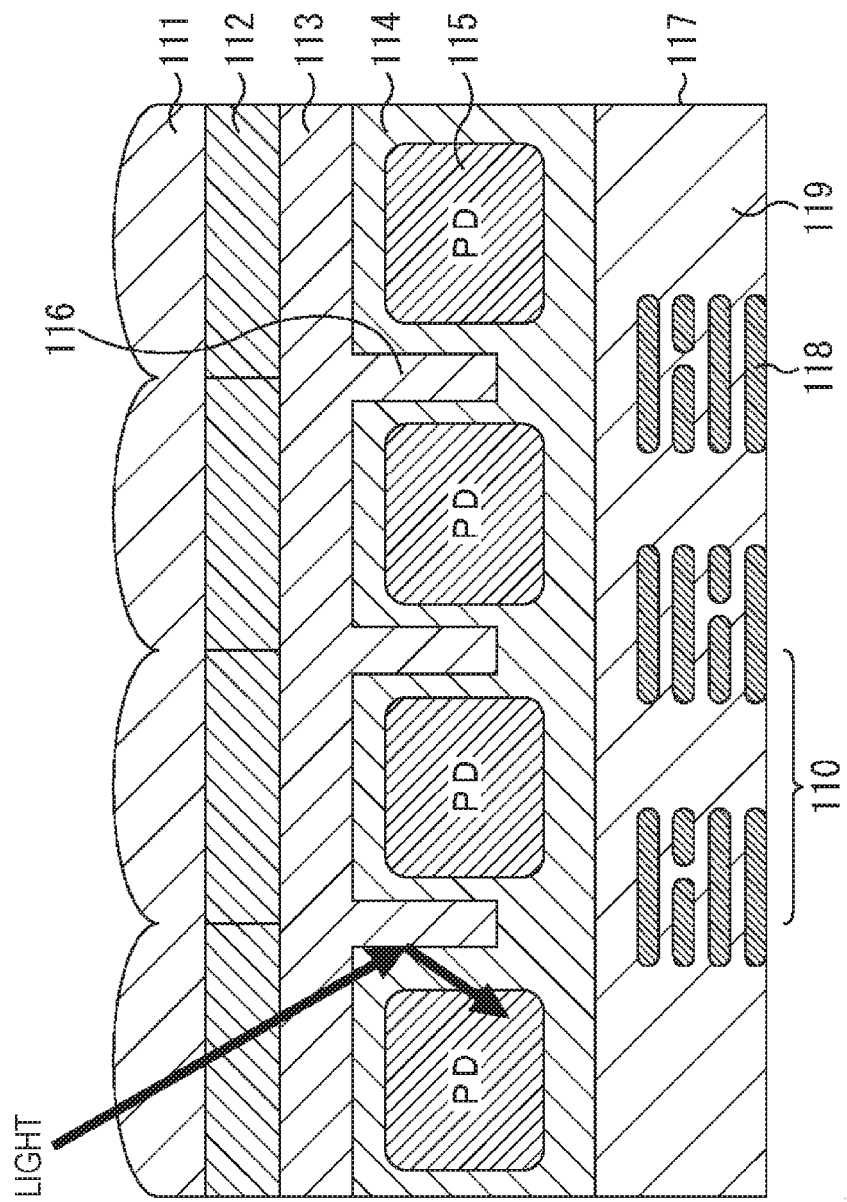
FIG. 3 is a vertical cross-sectional view illustrating a configuration example of a conventional pixel.

FIG. 3 is a cross-sectional view illustrating a configuration example of a conventional pixel. For comparison with pixels to which the present technology is applied, conventional pixels will be described with reference to FIGS. 3, 4, 5A, and 5B. FIG. 3 illustrates a cross-sectional view of four pixels arranged in a horizontal direction.

In a solid-state imaging device, a photodiode (PD) 115 configuring the pixel 110 receives incident light incident from a back surface (an upper surface in FIG. 3) of a semiconductor substrate 114. A flattening film 113, a color filter (CF) 112, and a microlens 111 are provided above the PD 115. The PD 115 receives the incident light, which has sequentially traveled in each part and has been incident, on a light receiving surface and performs photoelectric conversion.

For example, in the PD 115, an n-type semiconductor region is formed as an electric charge storage region that accumulates electric charges (electrons). In the PD 115, the n-type semiconductor region is provided inside a p-type semiconductor region of the semiconductor substrate 114. As illustrated in FIG. 3, the PD 115 is formed with the n-type semiconductor region surrounded by the p-type semiconductor region.

Figure 4:
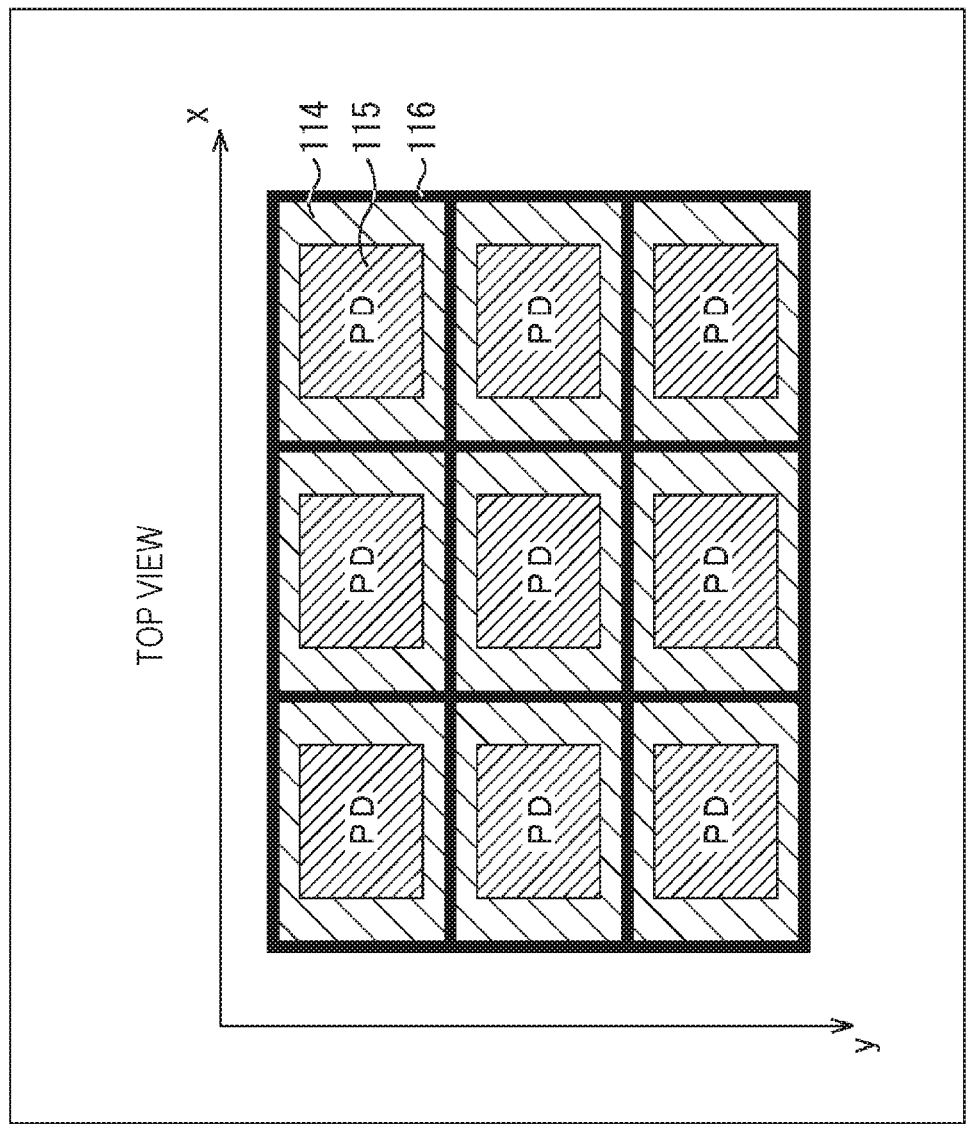
FIG. 4 is a plan view of a front surface side of a conventional pixel.

A pixel isolation portion 116 that electrically isolates the plurality of pixels 110 is provided inside the semiconductor substrate 114, and the PD 115 is provided in a region partitioned by the pixel isolation portion 116. In a case where the solid-state imaging device is viewed from an upper surface side in FIG. 3, the pixel isolation portion 116 is formed in a grid-like manner so as to lie between the plurality of pixels 110, for example, and the PD 115 is formed in the region partitioned by the pixel isolation portion 116, as illustrated in FIG. 4. Furthermore, the semiconductor substrate 114 as the p-type semiconductor region is formed between the PD 115 and the pixel isolation portion 116.

In each PD 115, an anode is grounded. In the solid-state imaging device, a signal charge (for example, electrons) accumulated by the PD 115 is read out via a transfer Tr (MOS FET, not illustrated) or the like and is output to a vertical signal line (VSL, not illustrated) as an electrical signal.

A wiring layer 117 is provided on a front surface (lower surface) of the semiconductor substrate 114, the front surface being opposite to the back surface (upper surface) on which the CF 112, the microlens 111, and the like are provided.

The wiring layer 117 includes wiring 118 and an insulating layer 119, and is formed such that the wiring 118 is electrically connected to each element in the insulating layer 119. The wiring layer 117 is a so-called multilayer wiring layer, and is formed such that an interlayer insulating film configuring the insulating layer 119 and the wiring 118 are alternately stacked a plurality of times. Here, as the wiring 118, wiring to a Tr for reading the electric charge from the PD 115, such as a transfer Tr, and each wiring such as a VSL are stacked via the insulating layer 119.

A support substrate (not illustrated in FIG. 3) is provided on a surface of the wiring layer 117, the surface being opposite to the side where the PD 115 is provided. For example, a substrate using a silicon semiconductor having several hundred μm in thickness is provided as the support substrate.

Although not illustrated in FIG. 3, a light shielding film may be provided. In the case where a light shielding film is provided, the light shielding film is provided on the back surface (upper surface in FIG. 3) side of the semiconductor substrate 114. The light shielding film is configured to shield part of the incident light traveling from above the semiconductor substrate 114 to below the semiconductor substrate 114.

The light shielding film is formed using a light shielding material that shields light. For example, the light shielding film is formed by sequentially stacking a titanium (Ti) film and a tungsten (W) film. As another method, the light shielding film can be formed by, for example, sequentially stacking a titanium nitride (TiN) film and a tungsten (W) film. Furthermore, the light shielding film may be covered with nitride (N) or the like.

The pixel isolation portion 116 has FDTI when dug from the front surface (lower side in FIG. 3) of the substrate and RDTI when dug from the lower surface (upper side in FIG. 3) of the substrate. FDTI is an abbreviation for front side deep trench isolation. Furthermore, RDTI is an abbreviation for reverse side deep trench isolation. FIG. 3 illustrates the case where the pixel isolation portion 116 is the RDTI dug from the lower surface (upper side in FIG. 3) of the substrate.

Furthermore, the pixel isolation portion 116 may also has a structure called full trench formed through the semiconductor substrate 114. In FIG. 3, the case where the pixel isolation portion 116 is the RDTI will be described as an example, and hereinafter, the pixel isolation portion 116 will be described as RDTI 116.

By forming the RDTI 116 between the pixels, the RDTI 116 can prevent the incident light from an oblique direction from entering an adjacent pixel as illustrated on the left in FIG. 3 and can prevent color mixture.

The RDTI 116 is formed by etching or the like in a process of forming the pixel 110. For example, to form the RDTI 116, a Si substrate (the semiconductor substrate 114) is patterned by a lithography method and processed by dry etching method, so that the Si substrate is dug. At this time, a defect may occur in a sidewall of the RDTI 116 (a sidewall of the semiconductor substrate 114), and noise may be generated from this defect. This will be described with reference to FIGS. 5A and 5B.

Figure 5A:
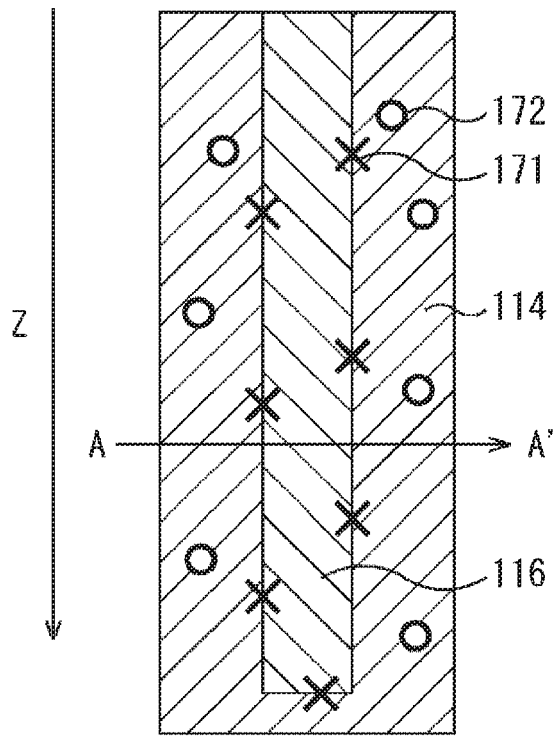
FIGS. 5A and 5B are views for describing generation of noise.
Figure 5B:
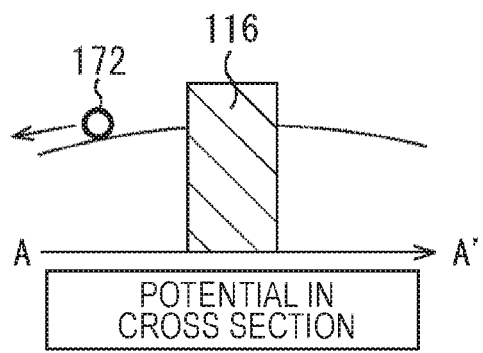

FIG. 5A are views illustrating an enlarged portion of the RDTI 116, and FIG. 5B illustrated below FIG. 5A is a view illustrating a potential in a cross section of line segment A-A'. Referring to FIG. 5A, a defect 171 occurs in the sidewall of the RDTI 116 at the time of etching or the like, as illustrated with an x mark in FIGS. 5A and 5B.

An electron 172 may be generated from the defect 171. Furthermore, the generated electron 172 may enter the PD 115. When the electron 172 enters the PD 115, the electron 172 causes noise. To prevent such generation of noise, the p-type semiconductor region (semiconductor substrate 114) is formed around the RDTI 116. Hereinafter, the p-type semiconductor region of the semiconductor substrate 114 will be simply described as p-type semiconductor region 114.

By surrounding the RDTI 116 with the p-type semiconductor region 114, recombination of holes of the p-type semiconductor region 114 and the generated electrons is promoted and noise is reduced. However, referring to the potential in the cross section illustrated in FIG. 5B, since there is a potential gradient between the RDTI 116 and the PD 115, the electron 172 generated in the defect 171 may be transferred to the PD 115 side.

Therefore, surrounding the RDTI 116 with the p-type semiconductor region 114 is not sufficient as measures for noise reduction. Therefore, a configuration for reducing noise as will be described below is adopted.

<Configuration Regarding Noise Reduction>

Figure 6A:
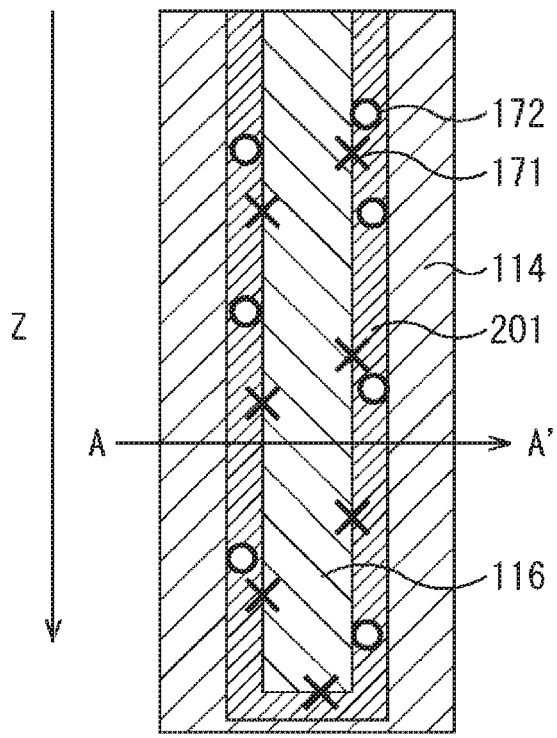
FIGS. 6A and 6B are views for describing suppression of noise.
Figure 6B:
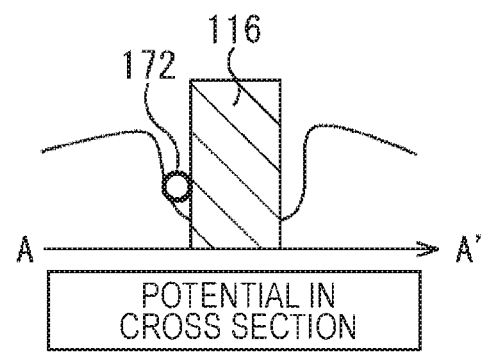

FIGS. 6A and 6B are views illustrating a configuration for noise reduction to which the present technology is applied. FIGS. 6A and 6B are enlarged views of the RDTI 116 and a potential view as in FIGS. 5A and 5B. FIG. 6A is a view illustrating an enlarged portion of the RDTI 116, and FIG. 6B illustrated below FIG. 6A is a view illustrating a potential in a cross section of line segment A-A'. In the following description, similar parts to those of the pixel 110 illustrated in FIGS. 3, 4, 5A, and 5B are denoted by the same reference numerals, and description thereof will be omitted as appropriate.

Referring to FIG. 6A, an n-type semiconductor region 201 is formed between the RDTI 116 and the p-type semiconductor region 114. The n-type semiconductor region 201 is a region containing an impurity functioning as n-type, for example, arsenic (As) or phosphorus (P), with respect to silicon (Si) in the case where the semiconductor substrate 114 is silicon, and functioning as an n-type semiconductor. By forming the n-type semiconductor region 201 on the sidewall side of the RDTI 116, the potential illustrated in FIG. 6B is obtained. That is, potential depression is formed near the sidewall of the RDTI 116.

By forming the potential depression, the electron 172 generated from the RDTI 116 is trapped in the potential depression and can be prevented from flowing out to the p-type semiconductor region 114 side. Therefore, the electron 172 generated from the RDTI 116 can be prevented from flowing to the PD 115 side, and the generation of noise can be suppressed.

Figure 7:
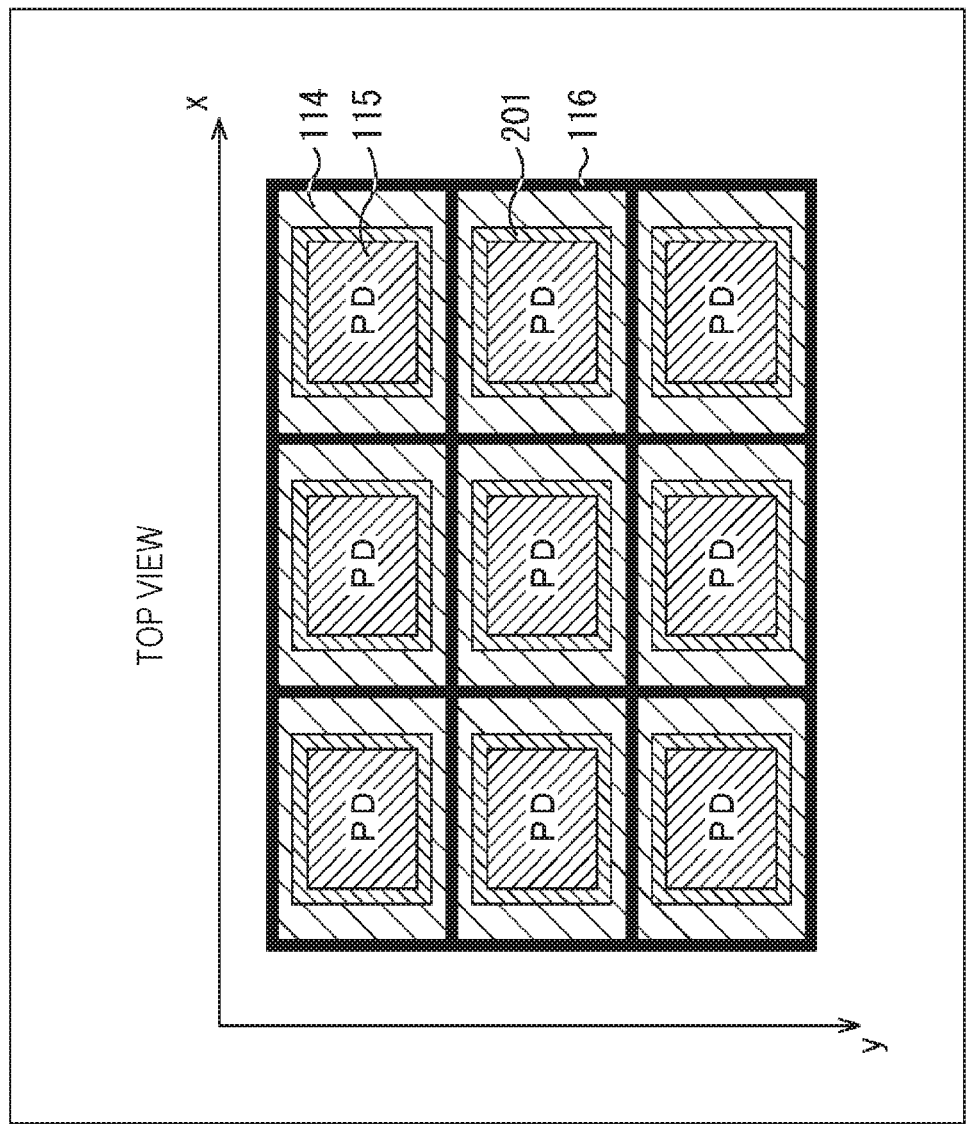
FIG. 7 is a plan view of a front surface side of a pixel to which the present technology is applied.
Figure 8:
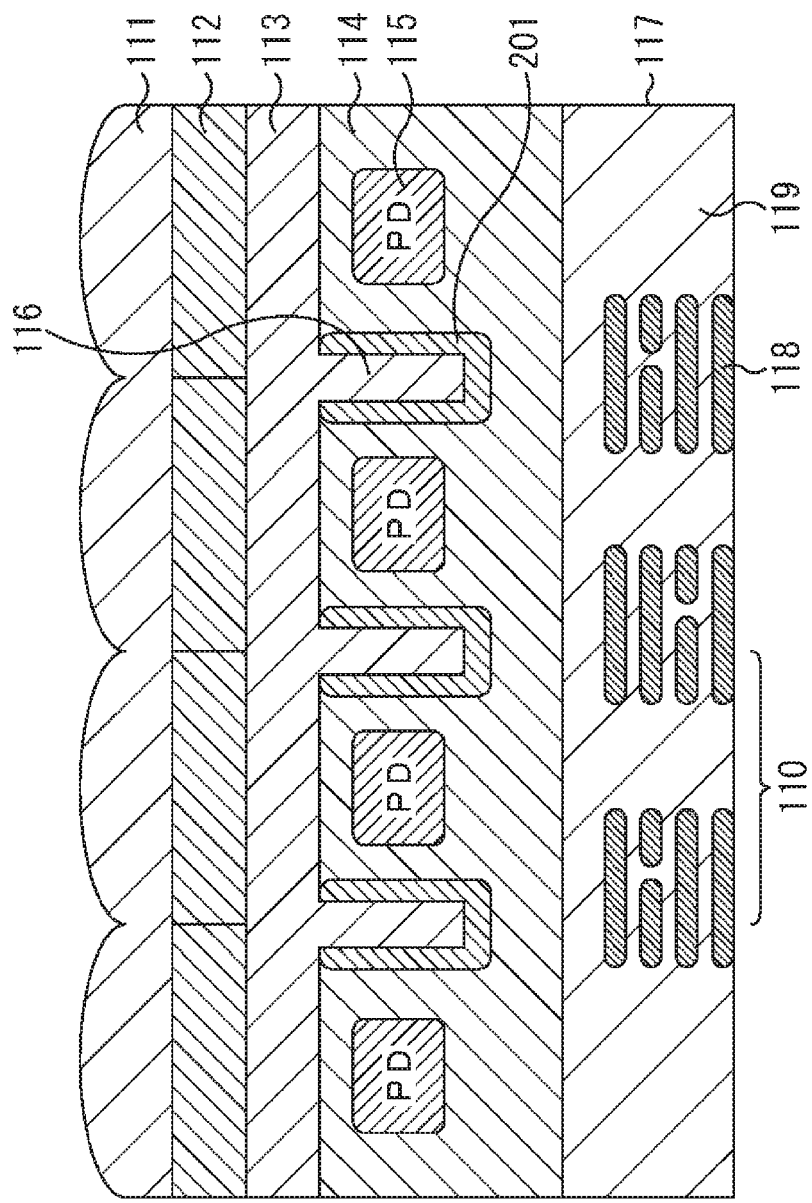
FIG. 8 is a vertical cross-sectional view illustrating a configuration example of a pixel to which the present technology is applied.

FIG. 7 illustrates a plan view of the pixels 110 having such a configuration viewed from the upper surface side, and FIG. 8 illustrates a vertical cross-sectional view. Referring to the plan view in FIG. 7, the pixel isolation portion 116 is formed in a grid-like manner so as to lie between the plurality of pixels 110, and the PDs 115 are formed in the regions partitioned by the pixel isolation portion 116.

Furthermore, the p-type semiconductor region 114 and the n-type semiconductor region 201 are formed between the PD 115 and the pixel isolation portion 116. The n-type semiconductor region 201 is formed to surround the PD 115, and the p-type semiconductor region 114 is formed to surround the n-type semiconductor region 201.

In this manner, the n-type semiconductor region 201, which is an n-type impurity region, is formed on the sidewall of the RDTI 116, and the p-type semiconductor region 114, which is a p-type impurity region, is formed to surround the n-type semiconductor region 201. The p-type semiconductor region 114 is a region containing an impurity functioning as p-type, for example, boron (B), with respect to silicon (Si) in the case where the semiconductor substrate 114 is silicon, and functioning as a p-type semiconductor.

When the n-type semiconductor region 201 and the p-type semiconductor region 114 are formed adjacent to each other as described above, a depletion layer exists between the n-type semiconductor region 201 and the p-type semiconductor region 114. Even if such a depletion layer is present, an effect of reducing noise to be described below can be obtained.

The thickness of the n-type semiconductor region 201 is set according to a p-type impurity concentration of the p-type semiconductor region 114 formed outside the n-type semiconductor region 201. For example, the n-type semiconductor region 201 is formed to be thicker as the p-type impurity concentration of the p-type semiconductor region 114 is higher.

Referring to FIG. 8, the n-type semiconductor region 201 is formed between the RDTI 116 and the p-type semiconductor region 114 at three sides out of four sides of the RDTI 116, where the p-type semiconductor region 114 is arranged. That is, as shown in FIG. 8, the n-type semiconductor region 201 is formed on a side surface and a bottom surface of the RDTI 116.

As described above, the p-type semiconductor region 114 and the n-type semiconductor region 201 are arranged between the RDTI 116 and the PD 115, so that the potential depression can be formed near the sidewall of the RDTI 116, whereby the unnecessary electrons are trapped in the potential depression (n-type semiconductor region 201), and the noise can be reduced.

The RDTI 116 is filled with a material that forms the flattening film 113 when the flattening film 113 is formed. Alternatively, the RDTI 116 may be filled with a material having a high light shielding property such as metal.

Although FIG. 8 illustrates an example where the n-type semiconductor region 201 is formed on the side surface and the bottom surface of the RDTI 116, a configuration in which the n-type semiconductor region 201 is formed only on the side surface or a configuration in which the n-type semiconductor region 201 is formed only on the bottom surface can be adopted. For example, in a case where accumulation of etching damages remarkably appears on the side surface, the configuration in which the n-type semiconductor region 201 is formed only on the side surface may be adopted. Furthermore, for example, in a case where accumulation of etching damages remarkably appears on the bottom surface, the configuration in which the n-type semiconductor region 201 is formed only on the bottom surface may be adopted.

Note that, here, the case in which the PD 115 is formed using the n-type semiconductor region has been described as an example. However, a configuration in which the PD 115 is formed using a p-type semiconductor region can be adopted. In the case where the PD 115 is formed using the p-type semiconductor region, the n-type semiconductor region is formed around the PD 115, and the p-type semiconductor region is formed between the n-type semiconductor region and the RDTI 116.

In other words, in the description above and below, the description of the case where electrons are main carriers will be continued as an example, and for example, as illustrated in FIG. 8, description of the case where the PD 115, the p-type semiconductor region 114, the n-type semiconductor region 201, and the RDTI 116 are formed in this order will be continued as an example. However, the present technology can be applied to a case where holes are the main carriers. In the case where the holes are the main carriers, the PD 115, the n-type semiconductor region, the p-type semiconductor region, and the RDTI 116 are formed in this order. That is, the p-type semiconductor region is formed around the RDTI 116, and the n-type semiconductor region is further formed around the p-type semiconductor region.

A first semiconductor region as a first conductivity-type semiconductor region having a high first impurity concentration is formed on the sidewall (and the bottom side) of the RDTI 116, and a second semiconductor region as a second conductivity-type semiconductor region having a high second impurity concentration is formed around the first semiconductor region.

In the case where the first impurity is the n-type impurity, the second impurity becomes the p-type impurity, and in the case where the second impurity is the p-type impurity, the second impurity becomes the n-type impurity.

In the following description, description of the case where the PD 115 is formed using the n-type semiconductor region will be continued as an example. However, the present technology can be applied to a case where the PD 115 is formed using the p-type semiconductor region in the following embodiments.

In the case of the configuration where the n-type semiconductor region 201 is formed around the RDTI 116 and the electrons generated from defects of the RDTI 116 are trapped, the electrons may be accumulated in the n-type semiconductor region 201. Therefore, as illustrated in FIG. 9, a configuration having a mechanism for discharging the electrons accumulated in the n-type semiconductor region 201 may be adopted.

Figure 9:
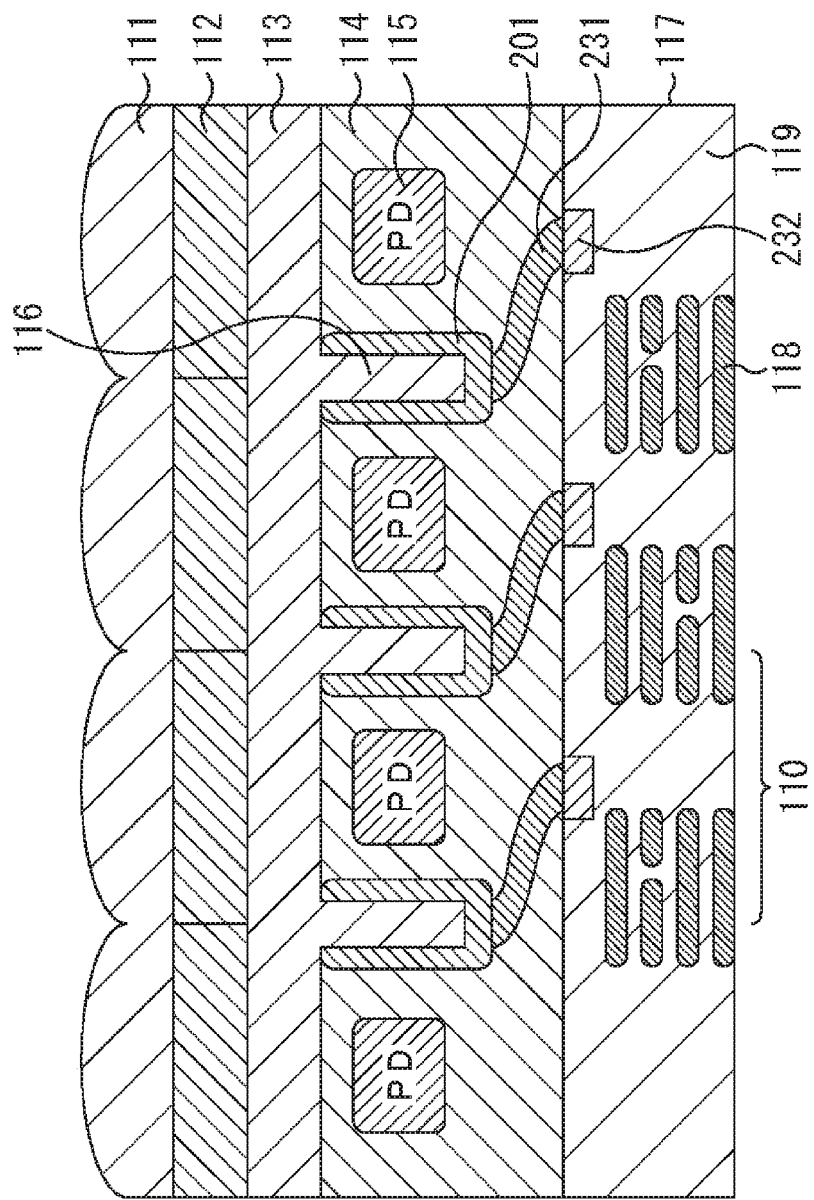
FIG. 9 is a vertical cross-sectional view illustrating a configuration example of another pixel.

The pixel 110 illustrated in FIG. 9 has a configuration in which a discharge path 231 and VDD wiring 232 are added to the pixel 110 illustrated in FIG. 8. The VDD wiring 232 is wiring connected to a constant voltage source Vdd and is provided in the pixel 110 to apply a predetermined voltage to a pixel transistor or the like.

Note that the VDD wiring 232 is not illustrated in FIG. 8 and the like, but the VDD wiring 232 is formed in the wiring layer 117.

The discharge path 231 connecting such VDD wiring 232 included in the wiring layer 117 and the n-type semiconductor region 201 is provided. By providing the discharge path 231 in this way and connecting one end of the discharge path 231 with the n-type semiconductor region 201 and the other end with the VDD wiring 232, the electrons accumulated in the n-type semiconductor region 201 can be discharged to the VDD wiring 232 via the discharge path 231.

The discharge path 231 can be formed by creating a potential serving as a path from the n-type semiconductor region 201 to the VDD wiring 232. Furthermore, the discharge path 231 may be formed using a conductor such as metal.

In the case of providing the discharge path 231 in this manner, the n-type semiconductor region 201 may be provided with a concentration gradient so as to form a potential gradient by which unnecessary electric charges easily move to the VDD wiring 232. For example, the side close to the discharge path 231 (the lower side and the front surface side in FIG. 9) is higher in the n-type impurity concentration than the side distant from the discharge path 231 (the upper side and the back surface side in FIG. 9), of the n-type semiconductor region 201.

In the case where the concentration gradient is formed in the n-type semiconductor region 201, the concentration gradient may also be formed in the p-type semiconductor region 114. In the case where the concentration gradient is formed in the p-type semiconductor region 114, a similar gradient to the concentration gradient in the n-type semiconductor region 201 is formed.

For example, in the case where the n-type semiconductor region 201 is formed such that the n-type impurity concentration becomes high from the side close to the back surface to the side close to the front surface, the p-type semiconductor region 114 near the n-type semiconductor region 201 is also formed such that the p-type impurity concentration becomes high from the side close to the back surface to the side close to the front surface. Note that the concentration gradient includes not only a case where the concentration gradually changes but also a case of an abrupt change in which the concentration is low on the n-type semiconductor region 201 side and high on the VDD wiring 232 side, for example. A structure having an abrupt concentration gradient may be adopted as long as the structure is capable of discharging unnecessary electric charges.

As a structure for discharging the electric charges accumulated in the n-type semiconductor region 201, a structure for electrically connecting the RDTI 116 and an optical black (OPB) region and applying a voltage thereto to discharge the electric charges can be adopted. The OPB region is provided outside an effective pixel region of the imaging element and is provided for correcting each pixel value in the effective pixel region using a pixel value of the OPB region, which is used as a reference value of a black level.

The p-type semiconductor region 114 in the pixels 110 illustrated in FIGS. 8 and 9 can be formed by any of the following first to fifth formation methods.

First Method of Forming p-Type Semiconductor Region

In a front end of line (FEOL) process, p-type implantation is performed in advance around the RDTI 116 to form the p-type semiconductor region 114 around the RDTI 116. By the FEOL process, an element such as a transistor (for example, a transfer transistor) is formed on the front surface side of the pixel 110, and the PD 115 and the like are formed in the semiconductor substrate 114. Furthermore, in the FEOL process, the RDTI 116 is formed by lithography and dry etching, and after the trench is formed, p-type implantation is performed to form the p-type semiconductor region 114.

Second Method of Forming p-Type Semiconductor Region

After the RDTI 116 is formed, an SCF film for generating negative fixed electric charges is formed on the side surface (and the bottom surface) of the RDTI 116 to form the p-type semiconductor region 114 around the RDTI 116.

Third Method of Forming p-Type Semiconductor Region

After the RDTI 116 is formed, an SiO2 film containing boron (B) that is a P-type impurity is formed on the side surface (and the bottom surface) of the RDTI 116, and heat treatment is performed. By performing the heat treatment, boron (B) is solid-phase diffused from the SiO2 film to the Si substrate side, and the p-type semiconductor region 114 is formed.

Fourth Method of Forming p-Type Semiconductor Region

After the RDTI 116 is formed, impurities are introduced from the ET surface to the side surface (and the bottom surface) of the RDTI 116 by plasma doping to form the p-type semiconductor region 114 around the RDTI 116.

Fifth Method of Forming p-Type Semiconductor Region

After the RDTI 116 is formed, the side surface (and the bottom surface) of the RDTI 116 is obliquely ion-implanted to form the p-type semiconductor region 114 around the RDTI 116.

The n-type semiconductor region 201 in the pixels 110 illustrated in FIGS. 8 and 9 can be formed by any of the following first to third formation methods.

First Method of Forming n-Type Semiconductor Region

After the RDTI 116 is formed, an SCF film for generating positive fixed electric charges is formed on the side surface (and the bottom surface) of the RDTI 116 to form the n-type semiconductor region 201 around the RDTI 116.

By combining yttrium oxide (Y2O3), lanthanum oxide (La2O3), or the like with SiO2 for the SCF film, a film that generates positive fixed electric charges can be formed. Alternatively, a film for generating a positive potential is formed on the RDTI 116 by a work function difference between polysilicon doped with an n-type impurity and p-type silicon to form the n-type semiconductor region 201.

Second Method of Forming n-Type Semiconductor Region

After the RDTI 116 is formed, a solid-phase diffusion film containing an n-type impurity such as arsenic (As) is formed on the side surface (and the bottom surface) of the RDTI 116 and then heat treatment is performed to solid-phase diffuse arsenic (As), whereby the n-type semiconductor region 201 is formed. In the case where the n-type semiconductor region is formed by solid-phase diffusion of arsenic (As) after the p-type semiconductor region is formed by solid-phase diffusion of boron (B), a structure for surrounding the RDTI 116 with the n-type semiconductor region 201 and the p-type semiconductor region 114 can be created using the difference in thermal diffusion coefficient between the B system and the As system.

Third Method of Forming n-Type Semiconductor Region

After the RDTI 116 is formed, high-dose n-type implantation with low energy is performed to form the n-type semiconductor region 201 around the RDTI 116. In this case, damage can be reduced because of low energy implantation.

Furthermore, in the case of forming the p-type semiconductor region 114 around the RDTI 116 by implantation, implantation with a smaller mask is performed to form the n-type semiconductor region 201.

In the case of forming the n-type semiconductor region 201, a method of using implantation only for a locally shallow region by using the first formation method and the second formation method together can be adopted.

The p-type semiconductor region 114 and the n-type semiconductor region 201 can be formed by combining any one of the first to fifth methods of forming the p-type semiconductor region and the first to third methods of forming the n-type semiconductor region.

<Configuration Regarding Noise Reduction in FDTI>

As described above, the configuration of forming the potential depression by forming the n-type semiconductor region 201 around the RDTI 116 and trapping the electrons generated from the RDTI 116 is adopted. Such a configuration is applicable not only to the case where the pixel isolation portion 116 has the RDTI structure but also to the case where the pixel isolation portion 116 has the FDTI structure, for example. Hereinafter, a case where the present technology is applied to the case where the pixel isolation portion 116 is FDTI will be described.

Figure 10:
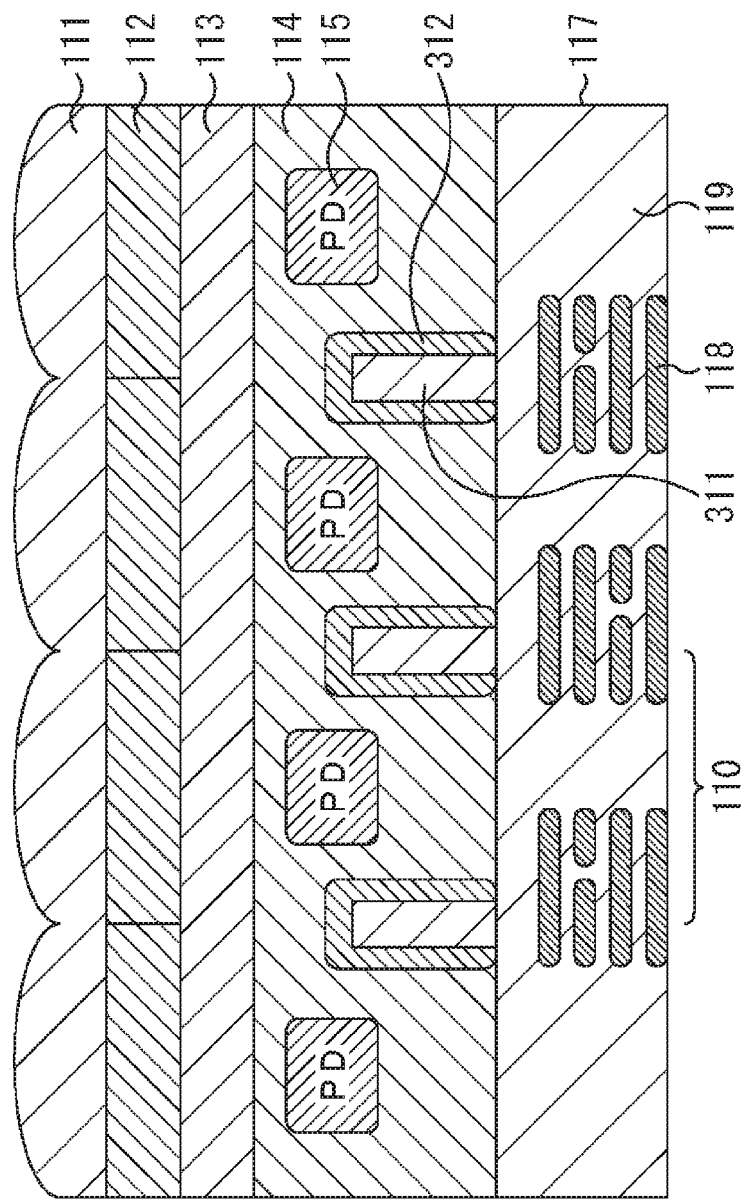
FIG. 10 is a vertical cross-sectional view illustrating a configuration example of another pixel.

FIG. 10 is a view illustrating a configuration of the pixel 110 to which the present technology is applied in the case where the pixel isolation portion 116 has the FDTI structure. Since the basic configuration is similar to the configuration of the pixel 110 in the case of applying the present technology to the RDTI 116 illustrated in FIG. 8, similar portions are denoted by the same reference numerals and description thereof will be omitted as appropriate.

Referring to FIG. 10, the pixel isolation portion 116 is formed using FDTI 311 when dug from the front surface (lower side in FIG. 10) of the substrate. Since the FDTI 311 is formed by being dug from the front surface of the substrate, the FDTI 311 has a shape opened to the wiring layer 117 side.

An n-type semiconductor region 312 is formed between the FDTI 311 and the p-type semiconductor region 114. By forming the n-type semiconductor region 312 on the sidewall side of the FDTI 311, the potential becomes the potential as illustrated in FIG. 6B, for example, as in the case of the RDTI 116. That is, a potential depression is formed near the sidewall of the FDTI 311.

By forming the potential depression, the electron 172 generated in the FDTI 311 is trapped in the potential depression and can be prevented from flowing out to the p-type semiconductor region 114 side. Therefore, the electron 172 generated in the FDTI 311 can be prevented from flowing to the PD 115 side, and the generation of noise can be suppressed.

In the pixel 110 illustrated in FIG. 10, the n-type semiconductor region 312 is formed on three sides out of four sides of the FDTI 311, where the p-type semiconductor region 114 is arranged. That is, as shown in FIG. 10, the n-type semiconductor region 312 is formed on a side surface and a bottom surface (upper surface) of the FDTI 311. Although FIG. 10 illustrates an example where the n-type semiconductor region 312 is formed on the side surface and the upper surface of the FDTI 311, a configuration in which the n-type semiconductor region 312 is formed only on the side surface or a configuration in which the n-type semiconductor region 312 is formed only on the upper surface can be adopted.

In the case of the configuration where the n-type semiconductor region 201 is formed around the FDTI 311 and the electrons generated from defects of the FDTI 311 are trapped, the electrons may be accumulated in the n-type semiconductor region 312. Therefore, as illustrated in FIG. 11, a configuration having a mechanism for discharging the electrons accumulated in the n-type semiconductor region 312 may be adopted.

Figure 11:
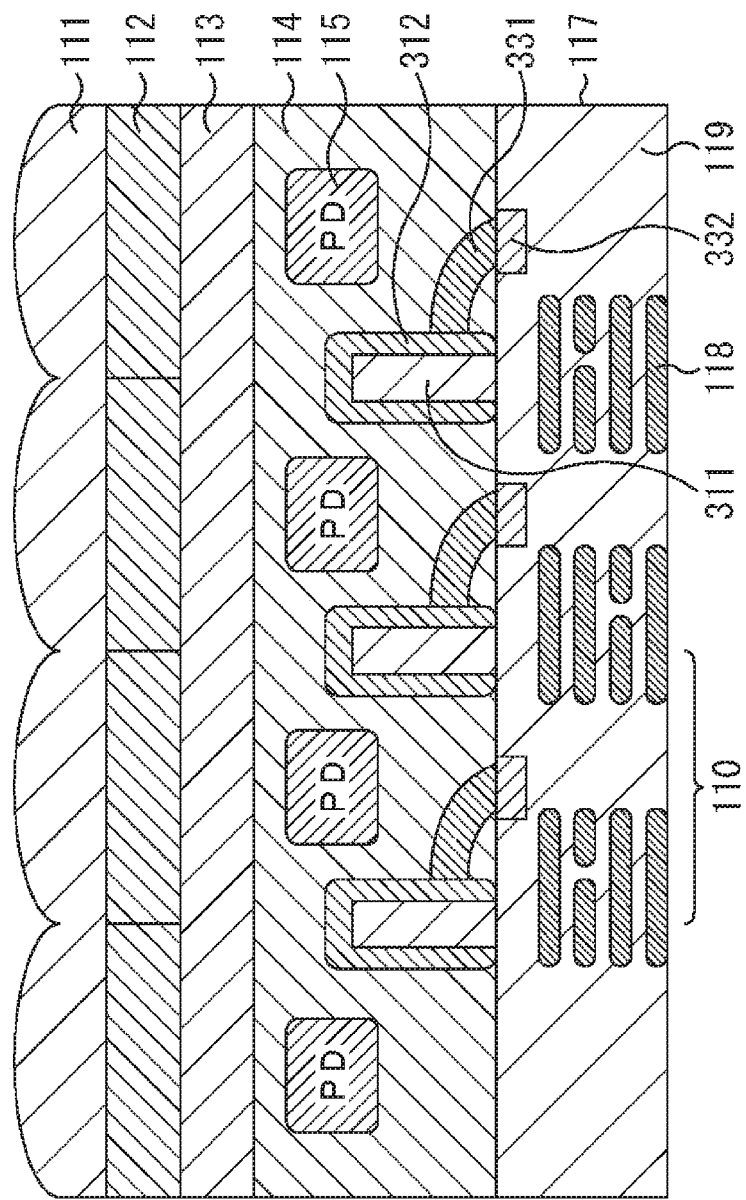
FIG. 11 is a vertical cross-sectional view illustrating a configuration example of another pixel.

The pixel 110 illustrated in FIG. 11 has a configuration in which a discharge path 331 and VDD wiring 332 are added to the pixel 110 illustrated in FIG. 10. By providing the VDD wiring 332 included in the wiring layer 117 and the discharge path 331 connecting the n-type semiconductor region 312, the electrons accumulated in the n-type semiconductor region 312 can be discharged to the VDD wiring 332 through the discharge path 331. The discharge path 331 can be formed by creating a potential serving as a path from the n-type semiconductor region 312 to the VDD wiring 332. Furthermore, the discharge path 331 may be formed using a conductor such as metal.

In the case of providing the discharge path 331 in this manner, the n-type semiconductor region 312 may be provided with a concentration gradient so as to form a potential gradient by which unnecessary electric charges easily move to the VDD wiring 332. Furthermore, in the case where the concentration gradient is formed in the n-type semiconductor region 312, the concentration gradient may also be formed in the p-type semiconductor region 114.

As a structure for discharging the electric charges accumulated in the n-type semiconductor region 312, a structure for electrically connecting the FDTI 311 and an optical black (OPB) region and applying a voltage thereto to discharge the electric charges can be adopted.

Figure 12:
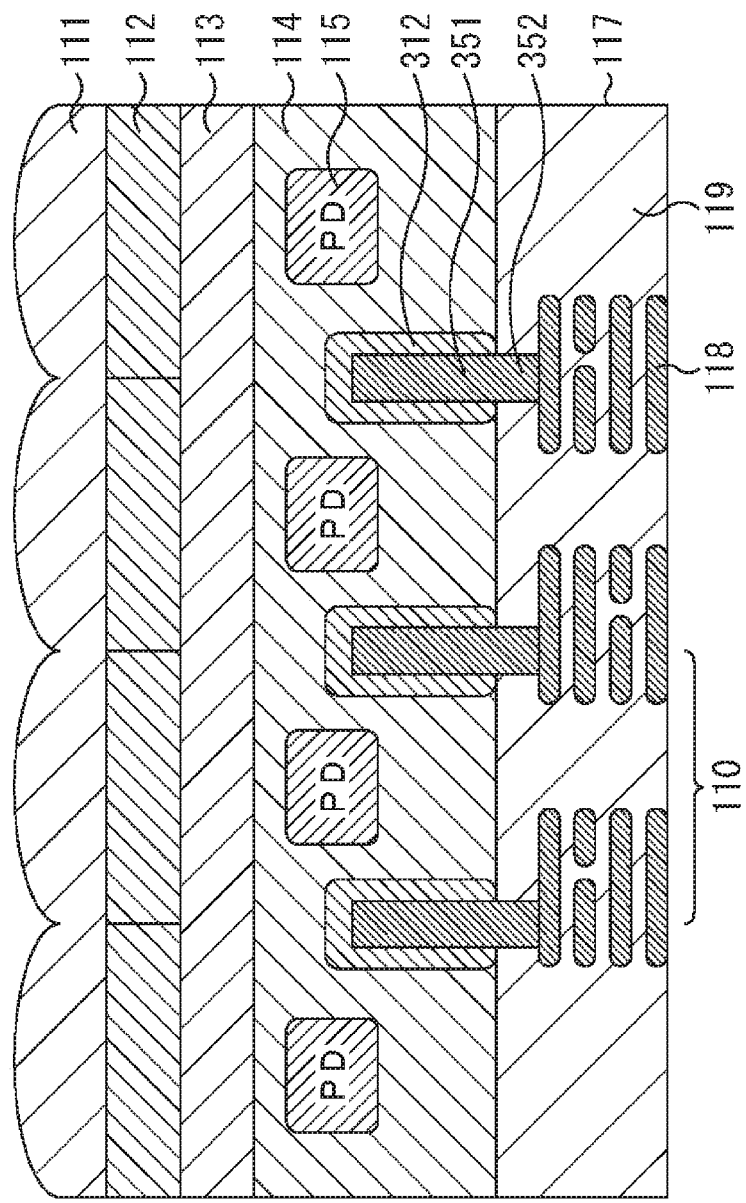
FIG. 12 is a vertical cross-sectional view illustrating a configuration example of another pixel.

Moreover, as a structure for discharging the electric charges accumulated in the n-type semiconductor region 312, the pixel 110 having the structure as illustrated in FIG. 12 can be adopted. Since the FDTI 311 has an opening on a wiring layer 106 side, the FDTI 311 is filled with a conductor 351 and the conductor 351 and the wiring 118 in the wiring layer 106 are connected.

The conductor 351 and the wiring 118 may be connected to each other through a contact 352, or the conductor 351 and the wiring 118 may be directly connected to each other. Furthermore, the conductor 351 may be provided in a part of the FDTI 311, and the conductor 351 may be connected to the wiring 118.

With such a configuration, the electric charges accumulated in the n-type semiconductor region 312 can be sucked out when a voltage is applied to the conductor 351 via the wiring 118.

In the case where the FDTI 311 is filled with the conductor 351, a material having a high light shielding property, for example, a metal such as copper or tungsten is used for the conductor 351 to improve the isolation performance between pixels and the light shielding property between pixels can be increased.

Although not illustrated, the n-type semiconductor region 312 on the wiring layer 106 side is made high in the n-type impurity concentration and is connected to the wiring 118, so that when a voltage is applied to the wiring 118, the electric charges accumulated in the n-type semiconductor region 312 can be sucked out.

The p-type semiconductor region in the pixels 110 illustrated in FIGS. 10 to 12 can be formed by any of the above-described first to fourth formation methods. Furthermore, the n-type semiconductor region in the pixels 110 illustrated in FIGS. 10 to 12 can be formed by any of the above-described first to third formation methods.

<Configuration Regarding Noise Reduction by Full Trench>

Next, a case of applying a full trench structure instead of the RDTI 116 and FDTI 311 will be described.

Figure 13:
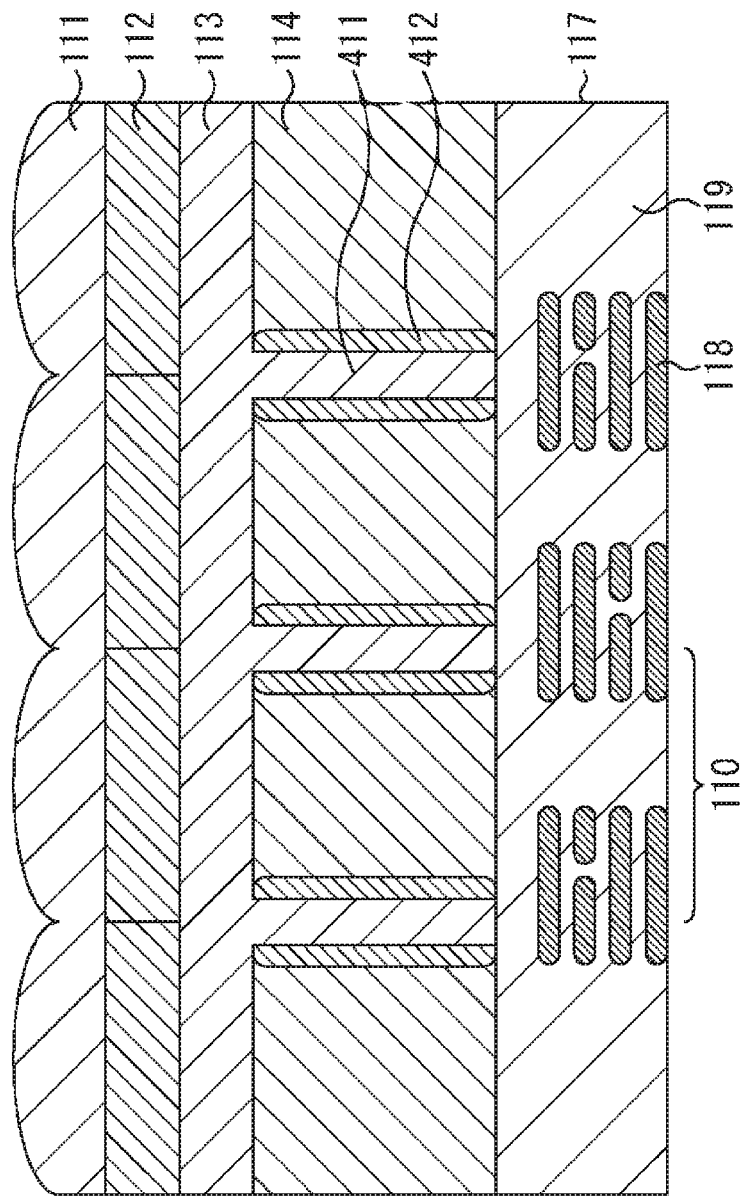
FIG. 13 is a vertical cross-sectional view illustrating a configuration example of another pixel.

FIG. 13 is a view illustrating a configuration of pixels 110 in a case where the present technology is applied to a full trench. Since the basic configuration is similar to the configuration of the pixel 110 in the case of applying the present technology to the RDTI 116 illustrated in FIG. 8, similar portions are denoted by the same reference numerals and description thereof will be omitted as appropriate.

With reference to FIG. 13, the pixel isolation portion 116 is formed using a full trench 411 dug through the substrate. The full trench 411 has a shape opened to the flattening film 113 side and the wiring layer 117 side.

An n-type semiconductor region 412 is formed between the full trench 411 and the p-type semiconductor region 114. By forming the n-type semiconductor region 412 on a sidewall side of the full trench 411, the potential becomes the potential as illustrated in FIG. 6B, for example, as in the case of the RDTI 116. That is, a potential depression is formed near the sidewall of the full trench 411.

By forming the potential depression, the electron 172 generated from the full trench 411 is trapped in the potential depression and can be prevented from flowing out to the p-type semiconductor region 114 side. Therefore, the electron 172 generated from the full trench 411 can be prevented from flowing to the PD 115 side, and the generation of noise can be suppressed.

In the case of the configuration where the n-type semiconductor region 412 is formed on the sidewall of the full trench 411 and the electrons generated from defects of the full trench 411 are trapped, the electrons may be accumulated in the n-type semiconductor region 412. Therefore, as illustrated in FIG. 14, a configuration having a mechanism for discharging the electrons accumulated in the n-type semiconductor region 412 may be adopted.

The pixel 110 illustrated in FIG. 14 has a configuration in which a discharge path 431 and VDD wiring 432 are added to the pixel 110 illustrated in FIG. 13. By providing the VDD wiring 432 included in the wiring layer 117 and the discharge path 431 connecting the n-type semiconductor region 412, the electrons accumulated in the n-type semiconductor region 412 can be discharged to the VDD wiring 432 through the discharge path 431. The discharge path 431 can be formed by creating a potential serving as a path from the n-type semiconductor region 412 to the VDD wiring 432. Furthermore, the discharge path 431 may be formed using a conductor such as metal.

In the case of providing the discharge path 431 in this manner, the n-type semiconductor region 412 may be provided with a concentration gradient so as to form a potential gradient by which unnecessary electric charges easily move to the VDD wiring 432. Furthermore, in the case where the concentration gradient is formed in the n-type semiconductor region 412, the concentration gradient may also be formed in the p-type semiconductor region 114.

As a structure for discharging the electric charges accumulated in the n-type semiconductor region 412, a structure for electrically connecting the full trench 411 and an optical black (OPB) region and applying a voltage thereto to discharge the electric charges may be adopted.

Moreover, as a structure for discharging the electric charges accumulated in the n-type semiconductor region 412, the pixel 110 having the structure as illustrated in FIG. 15 can be adopted. Since the full trench 411 has the opening in the wiring layer 106, the full trench 411 can be filled with a conductor 451, and the conductor 451 and the wiring 118 in the wiring layer 106 can be connected.

The conductor 451 and the wiring 118 may be connected to each other through a contact, or the conductor 451 and the wiring 118 may be directly connected to each other.

The electric charges accumulated in the n-type semiconductor region 412 can be sucked out when a voltage is applied to the conductor 451 via the wiring 118.

Although not illustrated, the n-type semiconductor region 412 on the wiring layer 106 side is made high in the n-type impurity concentration and is connected to the wiring 118, so that when a voltage is applied to the wiring 118, the electric charges accumulated in the n-type semiconductor region 412 can be sucked out.

The p-type semiconductor region in the pixels 110 illustrated in FIGS. 13 to 15 can be formed by any of the above-described first to fourth formation methods. Furthermore, the n-type semiconductor region in the pixels 110 illustrated in FIGS. 13 to 15 can be formed by any of the above-described first to third formation methods.

<Another Configuration of n-Type Semiconductor Region>

Figure 16A:
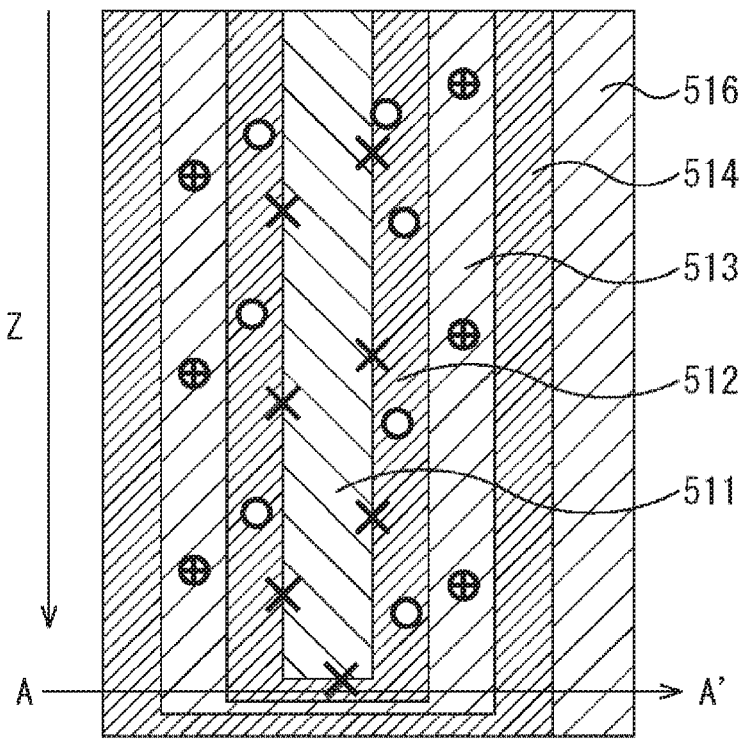
FIGS. 16A and 16B are vertical cross-sectional views illustrating a configuration example of another pixel.
Figure 16B:
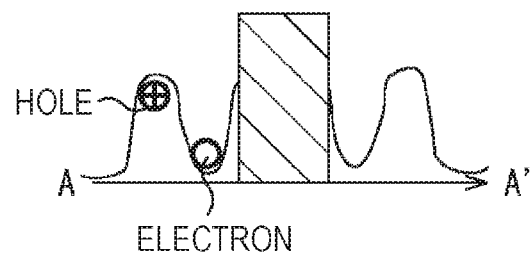

In the above-described embodiment, the case where the n-type semiconductor region and the p-type semiconductor region are each formed in one layer has been described as an example, but the n-type semiconductor region and the p-type semiconductor region may be formed in multilayer, as illustrated in FIGS. 16A and 16B.

FIGS. 16A and 16B are enlarged views of the pixel isolation portion 116 and a potential view, as in FIGS. 6A and 6B. FIGS. 16A and 16B illustrate the case where the pixel isolation portion 116 is RDTI 511.

FIG. 16A is a view illustrating an enlarged portion of the RDTI 511, and FIG. 6B illustrated below FIG. 6A is a view illustrating a potential in a cross section of line segment A-A'. Referring to FIG. 16A, an n-type semiconductor region 512 is formed to surround the RDTI 511. A p-type semiconductor region 513 is formed to surround the n-type semiconductor region 512.

Moreover, an n-type semiconductor region 514 is formed to surround the p-type semiconductor region 513, and a p-type semiconductor region 516 is formed to surround the n-type semiconductor region 514. Although not illustrated in FIGS. 16A and 16B, the p-type semiconductor region 516 is a p-type semiconductor region surrounding the PD 115.

FIGS. 16A and 16B illustrate an example in which the n-type semiconductor region and the p-type semiconductor region are each formed in two layers. Thus, when the n-type semiconductor region and the p-type semiconductor region are formed in a nested state, the potential as illustrated in FIG. 16B is formed.

A potential depression is formed near a sidewall of the RDTI 511. The potential depression is formed by the n-type semiconductor region 512. Furthermore, next to the potential depression, a peak of potential by the p-type semiconductor region 513 is formed.

Electrons generated in the RDTI 511 can be trapped by the potential depression formed near the sidewall of the RDTI 511. Furthermore, holes generated in the RDTI 511 can be trapped by the potential peak formed near the RDTI 116.

As described above, by forming the p-type semiconductor region and the n-type semiconductor region in multilayer around the RDTI 511, the configuration to trap the electrons and holes, which cause noise, can be obtained, and generation of noise can be further suppressed.

Such a configuration can be applied to any configuration when the pixel isolation portion 116 is formed using RDTI, using FDTI, or using a full trench.

Furthermore, by adopting the configuration of connecting the n-type semiconductor region and the VDD wiring, and the configuration of filling the trench with the conductor and connecting the conductor with the wiring, the mechanism for discharging generated electrons and holes can be applied.

According to the present technology, the structure for trapping noise electric charges generated from defects generated at the time of manufacturing a light shielding structure can be obtained. Furthermore, the structure for extracting the trapped electric charges to the outside can be obtained.

The noise electric charges can be prevented from entering the PD and electrical inter-pixel isolation becomes possible in addition to the optical inter-pixel isolation by the pixel isolation portion.

<Application Example to Endoscopic Surgical System>

Furthermore, for example, the technology (present technology) according to the present disclosure may be applied to an endoscopic surgical system.

Figure 17:
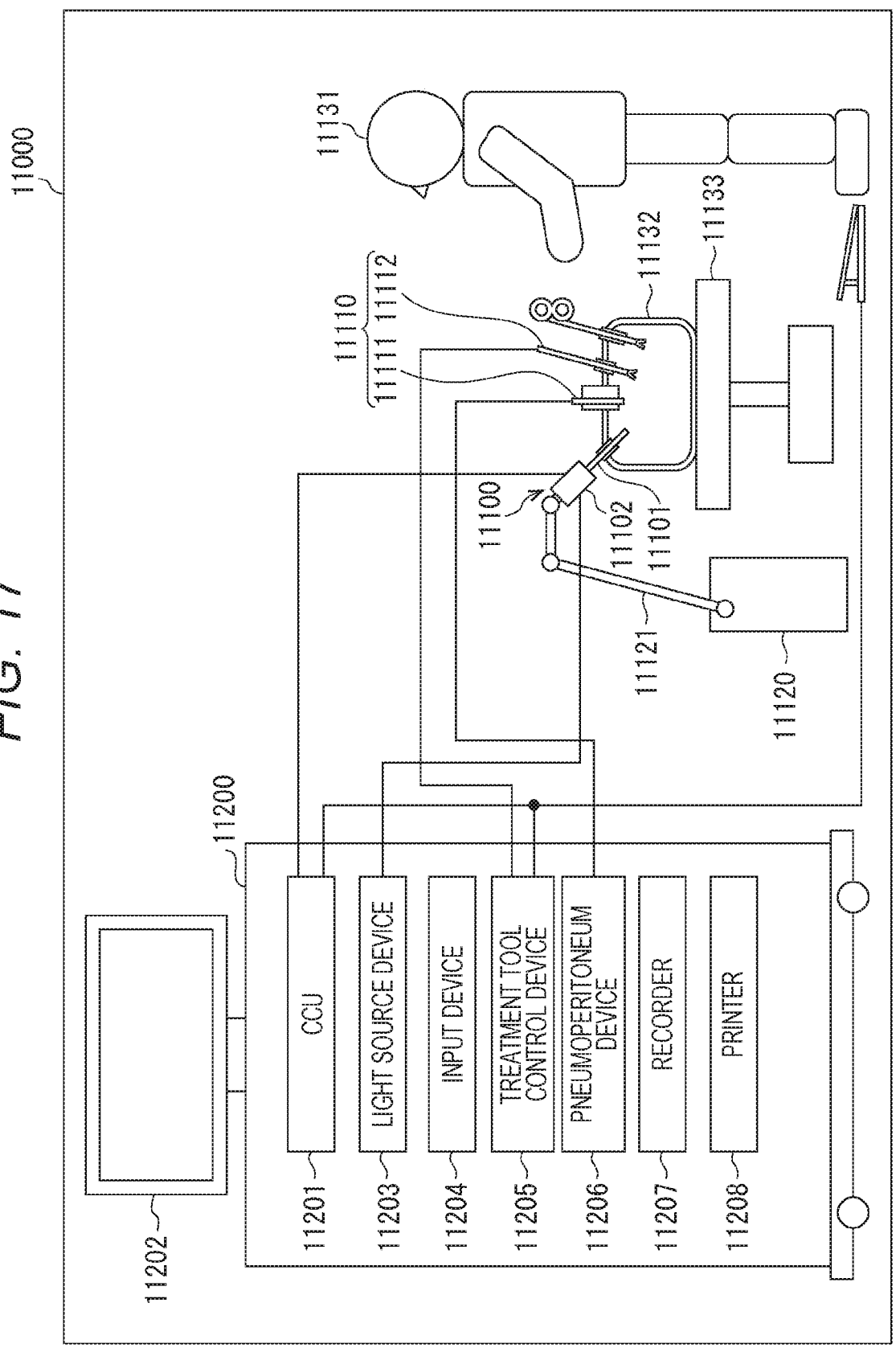
FIG. 17 is a diagram illustrating an example of a schematic configuration of an endoscopic surgical system.

FIG. 17 is a diagram illustrating an example of a schematic configuration of an endoscopic surgical system to which the technology according to the present disclosure (present technology) is applicable.

FIG. 17 illustrates a state in which an operator (surgeon) 11131 is performing surgery for a patient 11132 on a patient bed 11133, using the endoscopic surgical system 11000. As illustrated in FIG. 17, the endoscopic surgical system 11000 includes an endoscope 11100, other surgical instruments 11110 such as a pneumoperitoneum tube 11111 and an energy treatment tool 11112, a support arm device 11120 that supports the endoscope 11100, and a cart 11200 on which various devices for endoscope surgery are mounted.

The endoscope 11100 includes a lens-barrel 11101 and a camera head 11102. A region having a predetermined length from a distal end of the lens-barrel 11101 is inserted into a body cavity of the patient 11132. The camera head 11102 is connected to a proximal end of the lens-barrel 11101. FIG. 17 illustrates the endoscope 11100 configured as so-called a hard endoscope including the hard lens-barrel 11101. However, the endoscope 11100 may be configured as so-called a soft endoscope including a soft lens-barrel.

An opening portion in which an object lens is fit is provided in the distal end of the lens-barrel 11101. A light source device 11203 is connected to the endoscope 11100, and light generated by the light source device 11203 is guided to the distal end of the lens-barrel 11101 by a light guide extending inside the lens-barrel 11101 and an observation target in the body cavity of the patient 11132 is irradiated with the light through the object lens. Note that the endoscope 11100 may be a forward-viewing endoscope, may be an oblique-viewing endoscope, or may be a side-viewing endoscope.

An optical system and an imaging element are provided inside the camera head 11102, and reflected light (observation light) from the observation target is condensed to the imaging element by the optical system. The observation light is photoelectrically converted by the imaging element, and an electrical signal corresponding to the observation light, in other words, an image signal corresponding to an observed image is generated. The image signal is transmitted to a camera control unit (CCU) 11201 as raw data.

The CCU 11201 includes a central processing unit (CPU), a graphics processing unit (GPU), and the like, and generally controls an operation of the endoscope 11100 and a display device 11202. Moreover, the CCU 11201 receives the image signal from the camera head 11102, and applies various types of image processing for displaying an image based on the image signal, such as developing processing (demosaicing processing) or the like, to the image signal.

The display device 11202 displays the image based on the image signal to which the image processing has been applied by the CCU 11201, by control of the CCU 11201.

The light source device 11203 includes a light source such as a light emitting diode (LED) for example, and supplies irradiation light to the endoscope 11100 in capturing an operation portion or the like.

An input device 11204 is an input interface for the endoscopic surgical system 11000. A user can input various types of information and instructions to the endoscopic surgical system 11000 through the input device 11204. For example, the user inputs an instruction to change imaging conditions (a type of irradiation light, a magnification, a focal length, and the like) by the endoscope 11100, and the like.

A treatment tool control device 11205 controls drive of the energy treatment tool 11112, for cauterizing or incising a tissue, sealing a blood vessel, and the like. A pneumoperitoneum device 11206 sends a gas into the body cavity of the patient 11132 through the pneumoperitoneum tube 11111 to expand the body cavity for the purpose of securing a field of vision by the endoscope 11100 and a work space for the operator. A recorder 11207 is a device that can record various types of information regarding the surgery. A printer 11208 is a device that can print the various types of information regarding the surgery in various formats such as a text, an image, and a graph.

Note that the light source device 11203 that supplies the irradiation light in capturing the operation portion to the endoscope 11100 can be configured from a white light source configured from an LED, a laser light source, or a combination of the LED and the laser light source, for example. In a case where the white light source is configured from a combination of RGB laser light sources, output intensity and output timing of the respective colors (wavelengths) can be controlled with high accuracy. Therefore, adjustment of white balance of the captured image can be performed in the light source device 11203. Furthermore, in this case, the observation target is irradiated with the laser light from each of the RGB laser light sources in a time division manner, and the drive of the imaging element of the camera head 11102 is controlled in synchronization with the irradiation timing, so that images respectively corresponding to RGB can be captured in a time division manner. According to the method, a color image can be obtained without providing a color filter to the imaging element.

Furthermore, drive of the light source device 11203 may be controlled to change intensity of light to be output every predetermined time. The drive of the imaging element of the camera head 11102 is controlled in synchronization with change timing of the intensity of light and images are acquired in a time division manner, and the images are synthesized, so that a high-dynamic range image without so-called clipped blacks and flared highlights can be generated.

Furthermore, the light source device 11203 may be configured to be able to supply light in a predetermined wavelength band corresponding to special light observation. In the special light observation, for example, so-called narrow band imaging is performed by radiating light in a narrower band than the irradiation light (in other words, white light) at the time of normal observation, using wavelength dependence of absorption of light in a body tissue, to capture a predetermined tissue such as a blood vessel in a mucosal surface layer at high contrast. Alternatively, in the special light observation, fluorescence imaging may be performed to obtain an image by fluorescence generated by radiation of exciting light. In the fluorescence imaging, irradiating the body tissue with exciting light to observe fluorescence from the body tissue (self-fluorescence observation), or injecting a reagent such as indocyanine green (ICG) into the body tissue and irradiating the body tissue with exciting light corresponding to a fluorescence wavelength of the reagent to obtain a fluorescence image, for example, can be performed. The light source device 11203 can be configured to be able to supply narrow band light and/or exciting light corresponding to such special light observation.

Figure 18:
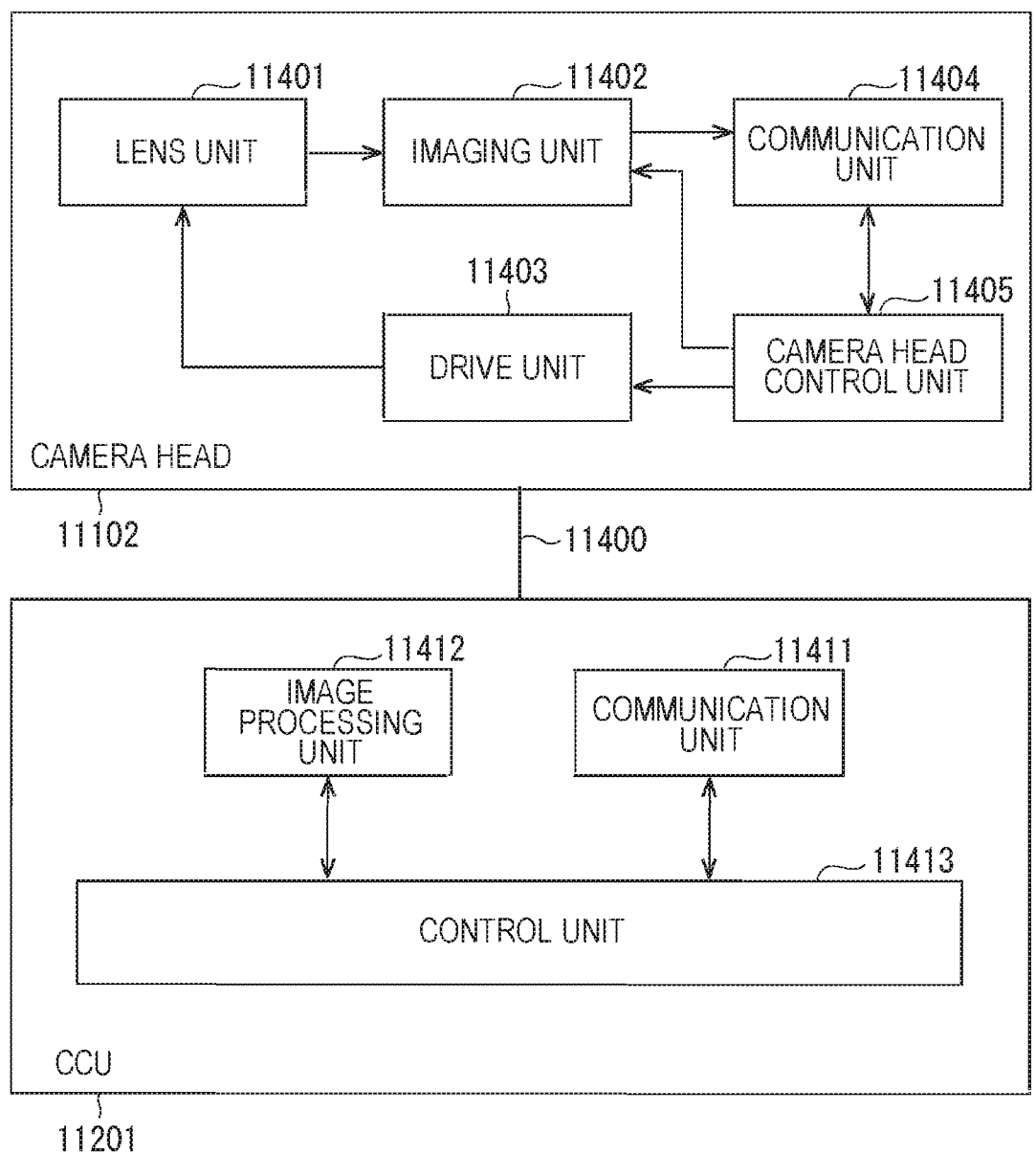
FIG. 18 is a block diagram illustrating an example of functional configurations of a camera head and a CCU.

FIG. 18 is a block diagram illustrating an example of functional configurations of the camera head 11102 and the CCU 11201 illustrated in FIG. 17.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected with each other by a transmission cable 11400.

The lens unit 11401 is an optical system provided in a connection portion between the camera head 11102 and the lens-barrel 11101. Observation light taken through the distal end of the lens-barrel 11101 is guided to the camera head 11102 and enters the lens unit 11401. The lens unit 11401 is configured by a combination of a plurality of lenses including a zoom lens and a focus lens.

The imaging element that configures the imaging unit 11402 may be one imaging element (so-called single imaging element) or may be a plurality of imaging elements (so-called multiple imaging elements). In a case where the imaging unit 11402 is configured by multiple imaging elements, for example, a color image may be obtained by generating image signals respectively corresponding to RGB by the imaging elements and synthesizing the image signals. Alternatively, the imaging unit 11402 may be configured by a pair of imaging elements for respectively obtaining image signals for right eye and for left eye corresponding to three-dimensional (3D) display. With the 3D display, the operator 11131 can more accurately grasp the depth of a biological tissue in the operation portion. Note that, in a case where the imaging unit 11402 is configured by the multiple imaging elements, a plurality of systems of the lens units 11401 may be provided corresponding to the imaging elements.

Furthermore, the imaging unit 11402 may not be necessarily provided in the camera head 11102. For example, the imaging unit 11402 may be provided immediately after the object lens inside the lens-barrel 11101.

The drive unit 11403 is configured by an actuator, and moves the zoom lens and the focus lens of the lens unit 11401 by a predetermined distance along an optical axis by control of the camera head control unit 11405. With the movement, a magnification and a focal point of a captured image by the imaging unit 11402 can be appropriately adjusted.

The communication unit 11404 is configured by a communication device for transmitting or receiving various types of information to or from the CCU 11201. The communication unit 11404 transmits the image signal obtained from the imaging unit 11402 to the CCU 11201 through the transmission cable 11400 as raw data.

Furthermore, the communication unit 11404 receives a control signal for controlling drive of the camera head 11102 from the CCU 11201 and supplies the control signal to the camera head control unit 11405. The control signal includes information regarding the imaging conditions such as information for specifying a frame rate of the captured image, information for specifying an exposure value at the time of imaging, and/or information for specifying the magnification and the focal point of the captured image, for example.

Note that the imaging conditions such as the frame rate, the exposure value, the magnification, and the focal point may be appropriately specified by the user or may be automatically set by the control unit 11413 of the CCU 11201 on the basis of the acquired image signal. In the latter case, so-called an auto exposure (AE) function, an auto focus (AF) function, and an auto white balance (AWB) function are incorporated in the endoscope 11100.

The camera head control unit 11405 controls drive of the camera head 11102 on the basis of the control signal received through the communication unit 11404 from the CCU 11201.

The communication unit 11411 is configured from a communication device for transmitting or receiving various types of information to or from the camera head 11102. The communication unit 11411 receives the image signal transmitted from the camera head 11102 through the transmission cable 11400.

Furthermore, the communication unit 11411 transmits a control signal for controlling drive of the camera head 11102 to the camera head 11102. The image signal and the control signal can be transmitted through telecommunication, optical communication, or the like.

The image processing unit 11412 applies various types of image processing to the image signal as raw data transmitted from the camera head 11102.

The control unit 11413 performs various types of control regarding imaging of the operation portion and the like by the endoscope 11100 and display of the captured image obtained through imaging of the operation portion and the like. For example, the control unit 11413 generates a control signal for controlling drive of the camera head 11102.

Furthermore, the control unit 11413 displays the captured image of the operation portion or the like in the display device 11202 on the basis of the image signal to which the image processing has been applied by the image processing unit 11412. At this time, the control unit 11413 may recognize various objects in the captured image, using various image recognition technologies. For example, the control unit 11413 can recognize a surgical instrument such as forceps, a specific living body portion, blood, mist at the time of use of the energy treatment tool 11112, or the like, by detecting a shape of an edge, a color, or the like of an object included in the captured image. The control unit 11413 may superimpose and display various types of surgery support information on the image of the operation portion using a result of the recognition, in displaying the captured image in the display device 11202. The superimposition and display, and presentation of the surgery support information to the operator 11131 can reduce a burden on the operator 11131 and enables the operator 11131 to reliably proceed with the operation.

The transmission cable 11400 that connects the camera head 11102 and the CCU 11201 is an electrical signal cable corresponding to communication of electrical signals, an optical fiber corresponding to optical communication, or a composite cable thereof.

Here, in the illustrated example, the communication has been performed in a wired manner using the transmission cable 11400. However, the communication between the camera head 11102 and the CCU 11201 may be wirelessly performed.

An example of an endoscopic surgical system to which the technology according to the present disclosure is applicable has been described. The technology according to the present disclosure is applicable to the camera head 11102 or the imaging unit 11402 of the camera head 11102, for example, of the above-described configurations. Specifically, for example, the imaging element 12 in FIG. 1 can be applied to the imaging unit 11402. By applying the technology according to the present disclosure to the imaging unit 11402, a more detailed and more precise operation portion image can be obtained. Therefore, the operator can reliably confirm the operation portion.

Note that, here, the endoscopic surgical system has been described as an example. However, the technology according to the present disclosure may be applied to microsurgery or the like, for example.

<Application Example to Moving Bodies>

Furthermore, for example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 19:
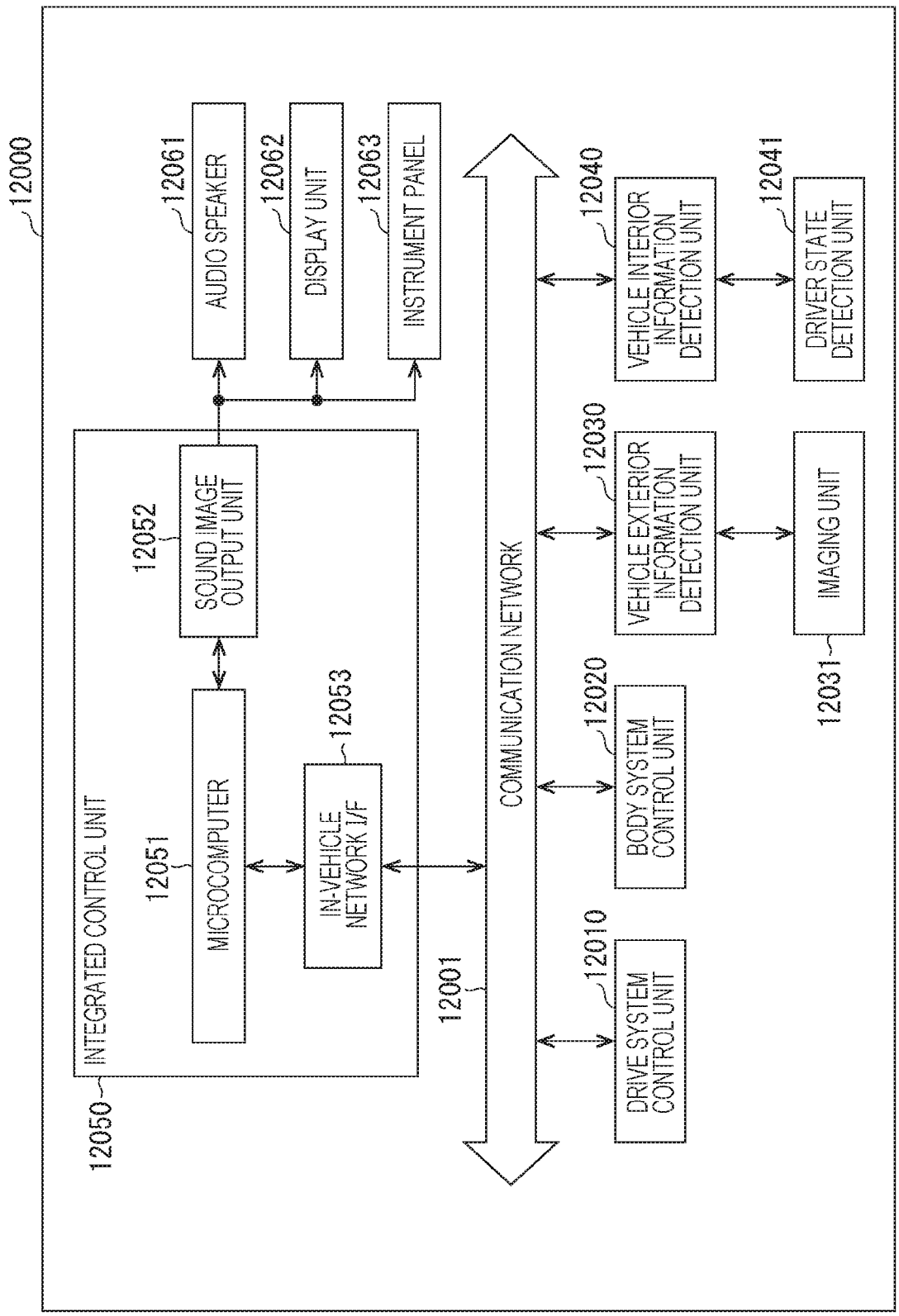
FIG. 19 is a block diagram illustrating an example of a schematic configuration of a vehicle control system.

FIG. 19 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 19, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to a light reception amount of the light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive force generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on a vehicular gap, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic drive of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare such as by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 19, as the output device, an audio speaker 12061, a display unit 12062, and an instrument panel 12063 are exemplarily illustrated. The display unit 12062 may include, for example, at least one of an on-board display or a head-up display.

Figure 20:
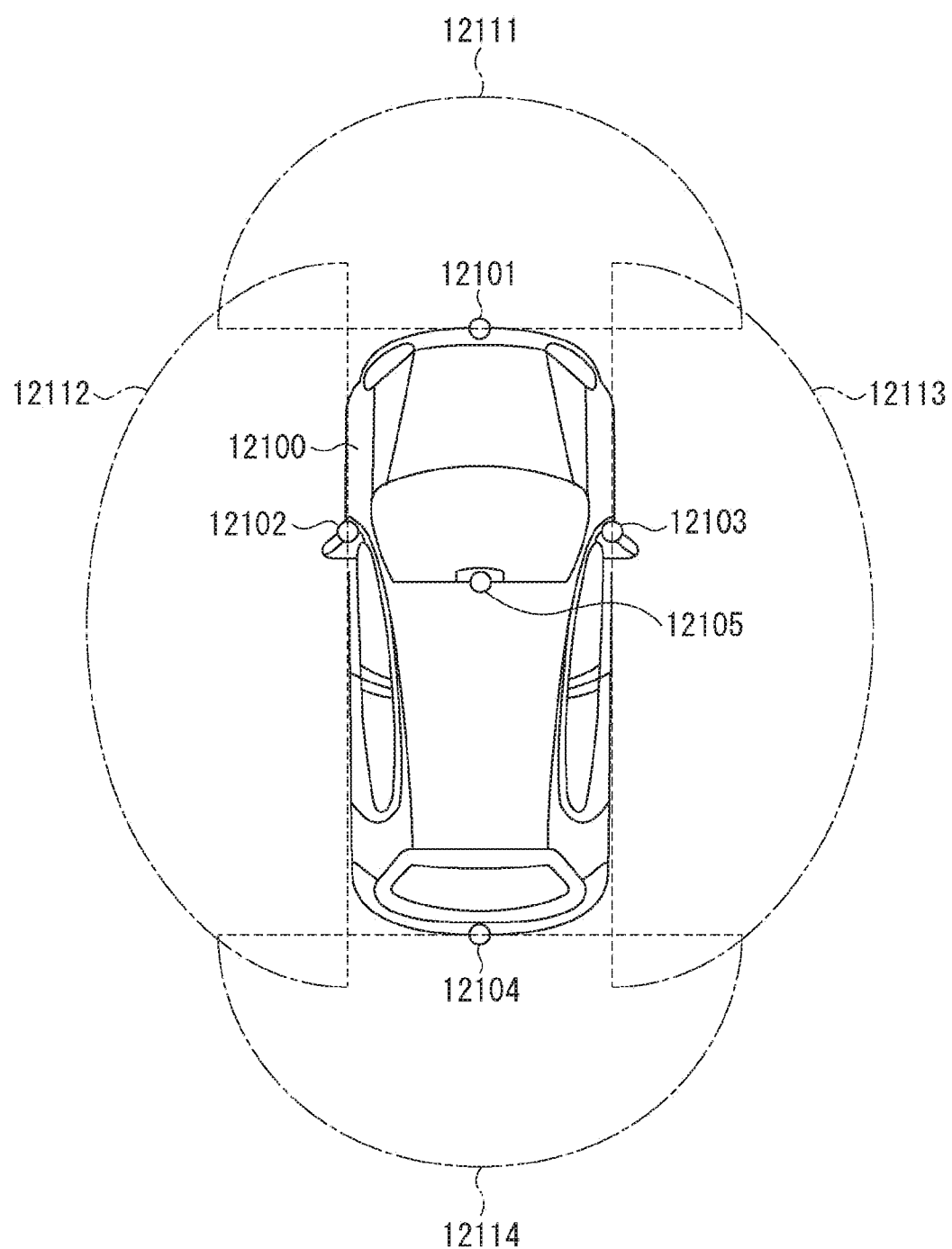
FIG. 20 is an explanatory diagram illustrating an example of installation positions of a vehicle exterior information detection unit and an imaging unit.

FIG. 20 is a diagram illustrating an example of an installation position of the imaging unit 12031.

In FIG. 20, imaging units 12101, 12102, 12103, 12104, and 12105 are included as the imaging unit 12031.

The imaging units 12101, 12102, 12103, 12104, and 12105 are provided at positions such as a front nose, side mirrors, a rear bumper, a back door, and an upper portion of a windshield in an interior of the vehicle 12100, for example. The imaging unit 12101 provided at the front nose and the imaging unit 12105 provided at an upper portion of the windshield in an interior of the vehicle mainly acquire front images of the vehicle 12100. The imaging units 12102 and 12103 provided at the side mirrors mainly acquire side images of the vehicle 12100. The imaging unit 12104 provided at the rear bumper or the back door mainly acquires a rear image of the vehicle 12100. The imaging unit 12105 provided at the upper portion of the windshield in the interior of the vehicle is mainly used for detecting a preceding vehicle, a pedestrian, an obstacle, a traffic signal, a traffic sign, a lane, or the like.

Note that FIG. 20 illustrates an example of capture ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of imaging elements or may be an image sensor having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract particularly a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic driving of autonomous travel without depending on an operation of the driver, and the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. The microcomputer 12051 then determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. Such recognition of a pedestrian is performed by a process of extracting characteristic points in the captured images of the imaging units 12101 to 12104, as the infrared camera, for example, and by a process of performing pattern matching processing for the series of characteristic points indicating a contour of an object and determining whether or not the object is a pedestrian. When the microcomputer 12051 determines that a pedestrian exists in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like representing the pedestrian at a desired position.

An example of a vehicle control system to which the technology according to the present disclosure is applicable has been described. The technology according to the present disclosure is applicable to the imaging unit 12031, of the above-described configurations, for example. Specifically, for example, the imaging device 10 in FIG. 1 can be applied to the imaging unit 12031. By applying the technology according to the present disclosure to the imaging unit 12031, the information outside the vehicle can be obtained in more detail and precise manner, and improvement of safety of automatic drive and the like can be implemented, for example.

In the present specification, the system refers to an entire apparatus configured by a plurality of apparatuses.

Note that the effects described in the present specification are merely examples and are not limited, and other effects may be exhibited.

Note that embodiments of the present technology are not limited to the above-described embodiments, and various modifications can be made without departing from the gist of the present technology.

Note that the present technology can also have the following configurations.

(1)

An imaging element including:

a substrate;

a first photoelectric conversion region provided on the substrate;

a second photoelectric conversion region provided on the substrate and adjacent to the first photoelectric conversion region;

a trench provided on the substrate and between the first photoelectric conversion region and the second photoelectric conversion region;

a first impurity region including a first impurity provided on the substrate and on a sidewall of the trench; and a second impurity region including a second impurity provided on the substrate and between the first photoelectric conversion region or the second photoelectric conversion region and the first impurity region.

(2)

The imaging element according to (1), in which the first impurity is an n-type impurity and the second impurity is a p-type impurity, or the first impurity is a p-type impurity and the second impurity is an n-type impurity, with respect to the substrate.

(3)

The imaging element according to (1) or (2), in which the first impurity is arsenic or phosphorus.

(4)

The imaging element according to any one of (1) to (3), in which the second impurity is boron.

(5)

The imaging element according to any one of (1) to (4), in which the trench is one of a trench provided on a front surface side of the substrate, a trench provided on a back surface side of the substrate, or a trench provided through the substrate.

(6)

The imaging element according to any one of (1) to (5), further including:

an impurity region having one end in contact with the first impurity region and the other end in contact with wiring, in which an impurity concentration on a side of the first impurity region differs between the side of the first impurity region and a side of the wiring.

(7)

The imaging element according to any one of (1) to (5), in which a conductor in the trench is connected with wiring in a wiring layer.

(8)

The imaging element according to any one of (1) to (7), in which a concentration of the first impurity of the first impurity region differs between a back surface side and a front surface side of the substrate.

(9)

The imaging element according to any one of (1) to (8), in which a plurality of the first impurity regions and the second impurity regions is provided between the first photoelectric conversion region or the second photoelectric conversion region and the trench.

(10)

An imaging element including:

a substrate;

a first photoelectric conversion region provided on the substrate;

a second photoelectric conversion region provided on the substrate and adjacent to the first photoelectric conversion region;

a trench provided on the substrate and between the first photoelectric conversion region and the second photoelectric conversion region;

a first conductivity-type semiconductor region by a first impurity provided on the substrate and on a sidewall of the trench; and a second conductivity-type semiconductor region by a second impurity provided on the substrate and between the first photoelectric conversion region or the second photoelectric conversion region and the first conductivity-type semiconductor region.

(11)

An electronic device in which an imaging element is mounted, the imaging element including:

a substrate;

a first photoelectric conversion region provided on the substrate;

a second photoelectric conversion region provided on the substrate and adjacent to the first photoelectric conversion region;

a trench provided on the substrate and between the first photoelectric conversion region and the second photoelectric conversion region;

a first impurity region including a first impurity provided on the substrate and on a sidewall of the trench; and a second impurity region including a second impurity provided on the substrate and between the first photoelectric conversion region or the second photoelectric conversion region and the first impurity region.

REFERENCE SIGNS LIST

10 Imaging device
11 Lens group
12 Imaging element
13 DSP circuit
14 Frame memory
15 Display unit
16 Recording unit
17 Operation system
18 Power supply system
19 Bus line
20 CPU
41 Pixel array unit
42 Vertical drive unit
43 Column processing unit
44 Horizontal drive unit
45 System control unit
46 Pixel drive line
47 Vertical signal line
48 Signal processing unit
49 Data storage unit
106 Wiring layer
110 Pixel
111 Microlens
113 Flattening film
114 p-type semiconductor region
116 Pixel isolation portion
117 Wiring layer
118 Wire
119 Insulating layer
171 Defect
172 Electron
201 n-type semiconductor region
231 Discharge path
232 VDD wiring
312 n-type semiconductor region
331 Discharge path
332 VDD wiring
351 Conductor
352 Contact
411 Full trench
412 n-type semiconductor region
431 Discharge path
432 VDD wiring
451 Conductor
512 n-type semiconductor region
513 p-type semiconductor region
514 n-type semiconductor region
516 p-type semiconductor region

The invention claimed is:

1. An imaging element, comprising:
a substrate;
a first photoelectric conversion region on the substrate;
a second photoelectric conversion region on the substrate and adjacent to the first photoelectric conversion region;

a trench on the substrate and between the first photoelectric conversion region and the second photoelectric conversion region;
a first impurity region including a first impurity on the substrate and on a sidewall of the trench; and
a second impurity region including a second impurity on the substrate and between the first photoelectric conversion region or the second photoelectric conversion region and the first impurity region, wherein
a concentration of the first impurity of the first impurity region differs between a back surface side of the substrate and a front surface side of the substrate.

2. The imaging element according to claim 1, wherein the first impurity is an n-type impurity and the second impurity is a p-type impurity, or the first impurity is a p-type impurity and the second impurity is an n-type impurity, with respect to the substrate.

3. The imaging element according to claim 1, wherein the first impurity is arsenic or phosphorus.

4. The imaging element according to claim 1, wherein the second impurity is boron.

5. The imaging element according to claim 1, wherein the trench is one of a trench on a front surface side of the substrate, a trench on a back surface side of the substrate, or a trench through the substrate.

6. The imaging element according to claim 1, further comprising:
an impurity region having one end in contact with the first impurity region and the other end in contact with wiring.

7. The imaging element according to claim 1, wherein a conductor in the trench is connected with wiring in a wiring layer.

8. The imaging element according to claim 1, wherein a plurality of the first impurity regions and the second impurity regions is between the first photoelectric conversion region or the second photoelectric conversion region and the trench.

9. An imaging element, comprising:
a substrate;
a first photoelectric conversion region on the substrate;
a second photoelectric conversion region on the substrate and adjacent to the first photoelectric conversion region;
a trench on the substrate and between the first photoelectric conversion region and the second photoelectric conversion region;
a first conductivity-type semiconductor region by a first impurity on the substrate and on a sidewall of the trench; and
a second conductivity-type semiconductor region by a second impurity on the substrate and between the first photoelectric conversion region or the second photoelectric conversion region and the first conductivity-type semiconductor region, wherein
a concentration of the first impurity of the first conductivity-type semiconductor region differs between a back surface side of the substrate and a front surface side of the substrate.

10. An electronic device in which an imaging element is mounted,
the imaging element comprising:
a substrate;
a first photoelectric conversion region provided on the substrate;
a second photoelectric conversion region on the substrate and adjacent to the first photoelectric conversion region;
a trench on the substrate and between the first photoelectric conversion region and the second photoelectric conversion region;
a first impurity region including a first impurity on the substrate and on a sidewall of the trench; and
a second impurity region including a second impurity on the substrate and between the first photoelectric conversion region or the second photoelectric conversion region and the first impurity region, wherein
a concentration of the first impurity of the first impurity region differs between a back surface side of the substrate and a front surface side of the substrate.

* * * * *